United States Patent [19]

Niino et al.

[11] Patent Number: 5,637,153
[45] Date of Patent: Jun. 10, 1997

[54] METHOD OF CLEANING REACTION TUBE AND EXHAUSTION PIPING SYSTEM IN HEAT PROCESSING APPARATUS

[75] Inventors: Reiji Niino, Wappingers Falls, N.Y.; Yoshiyuki Fujita, Kofu, Japan; Hideki Lee, Nirasaki, Japan; Yasuo Imamura, Yokohama, Japan; Toshiharu Nishimura, Kofu, Japan; Yuuichi Mikata, Kawasaki, Japan; Shinji Miyazaki, Yokkaichi, Japan; Takahiko Moriya, Yokohama, Japan; Katsuya Okumura, Poughkeepsie, N.Y.; Hitoshi Kato, Kofu, Japan

[73] Assignee: Tokyo Electron Limited, Tokyo, Japan

[21] Appl. No.: 429,159

[22] Filed: Apr. 26, 1995

Related U.S. Application Data

[60] Continuation-in-part of Ser. No. 336,067, Nov. 4, 1994, abandoned, which is a division of Ser. No. 54,229, Apr. 30, 1993, Pat. No. 5,380,370.

[30] Foreign Application Priority Data

Apr. 26, 1994 [JP] Japan .................... 6-112114

[51] Int. Cl.$^6$ ................ B08B 7/00; B08B 9/00
[52] U.S. Cl. .............. 134/22.11; 134/2; 134/3; 134/22.1; 134/22.12; 134/22.18; 134/37; 134/42; 438/905
[58] Field of Search .................. 134/2, 3, 22.1, 134/22.11, 22.12, 22.18, 37, 42; 156/643, 646; 422/170, 193

[56] References Cited

U.S. PATENT DOCUMENTS

| 5,294,262 | 3/1994 | Nishimura | 134/22.1 |
| 5,380,370 | 1/1995 | Niino et al. | 134/22.11 |

FOREIGN PATENT DOCUMENTS

| 63-58795 | 12/1989 | Japan . |
| 2-280792 | 9/1992 | Japan . |

*Primary Examiner*—Jeffrey Snay
*Attorney, Agent, or Firm*—Oblon, Spivak, McClelland, Maier & Neustadt, P.C.

[57] ABSTRACT

After a polysilicon film is formed on a wafer, a cleaning gas containing $ClF_3$ at 10 to 50 vol % is supplied into a reaction tube and an exhaust pipe system at a flow rate of 3000 to 3500 SCCM, so as to remove a polysilicon-based film deposited on an inner wall surface of the reaction tube, the surface of a member incorporated in the reaction tube, and an inner wall surface of the exhaust pipe system while the film forming process, by etching using $ClF_3$. The cleaning gas is supplied while the temperature in the reaction tube is maintained at 450° C. or higher, and in a pressure condition set at the maintained temperature such that an etching rate of the polysilicon-based film by the cleaning gas is higher than an etching rate of silicon which is the material of the reaction tube or the member incorporated in the reaction tube.

16 Claims, 15 Drawing Sheets

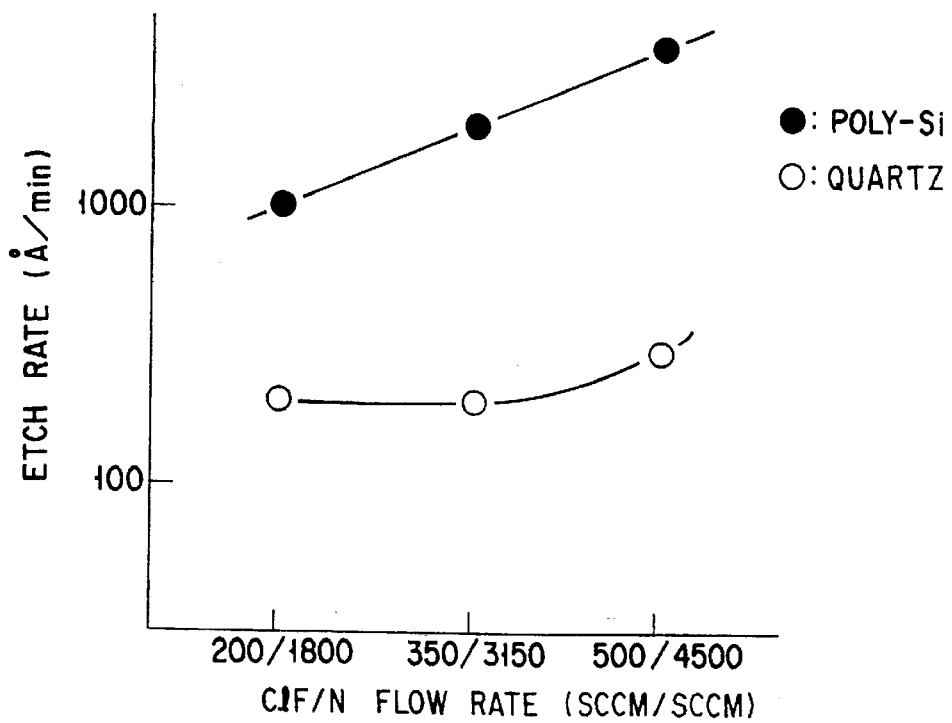
F I G. 3
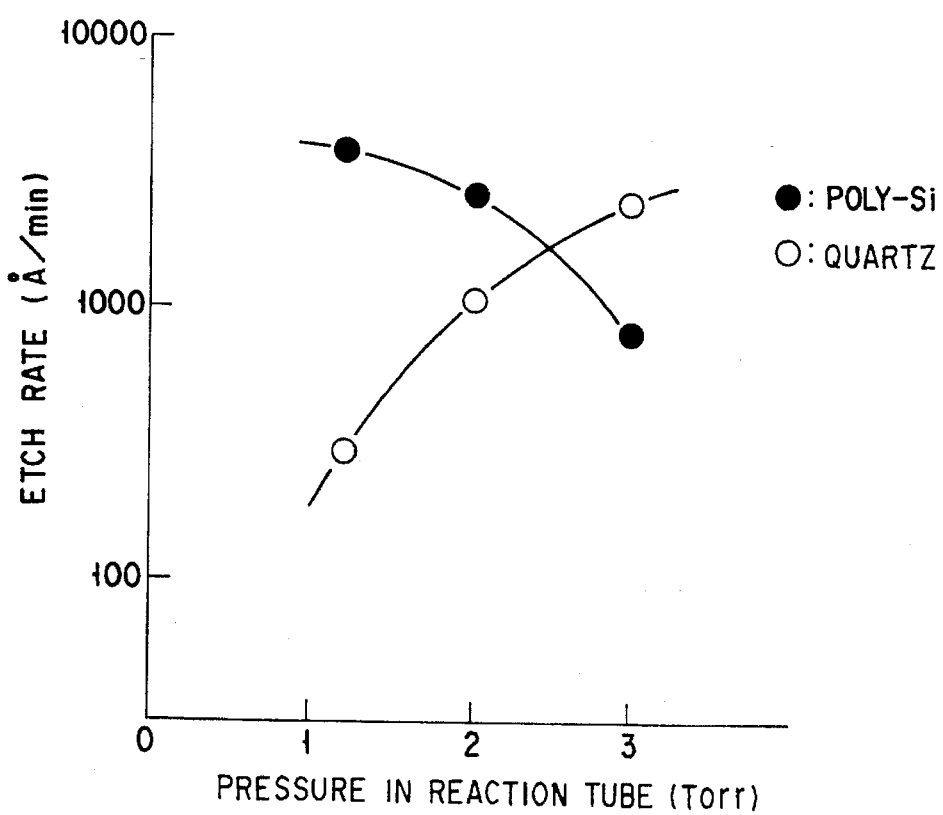
F I G. 4

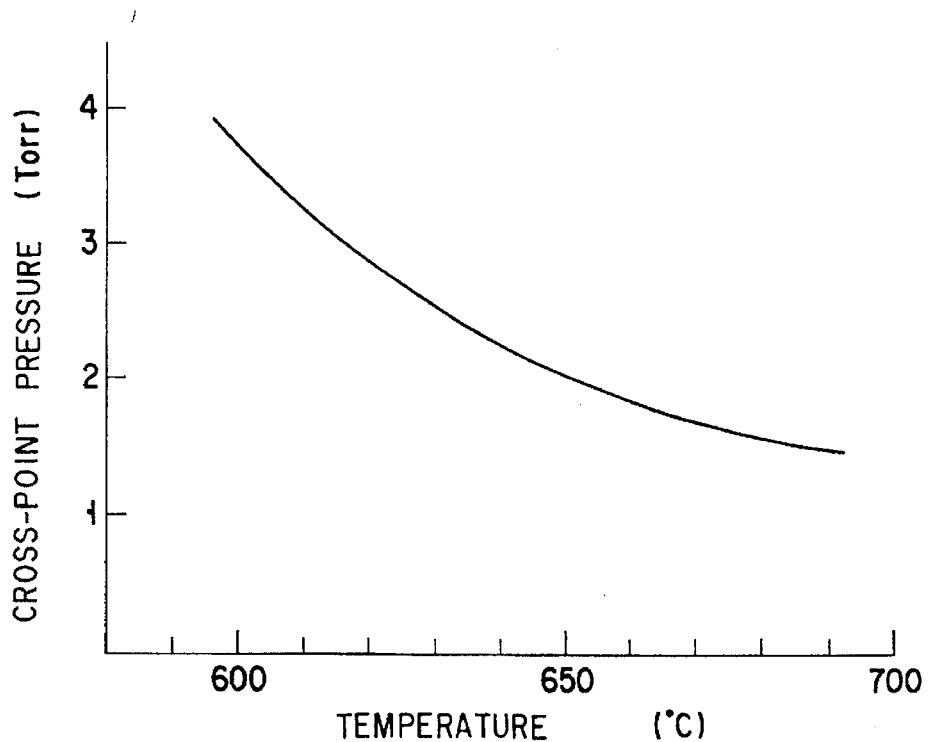
F I G. 5
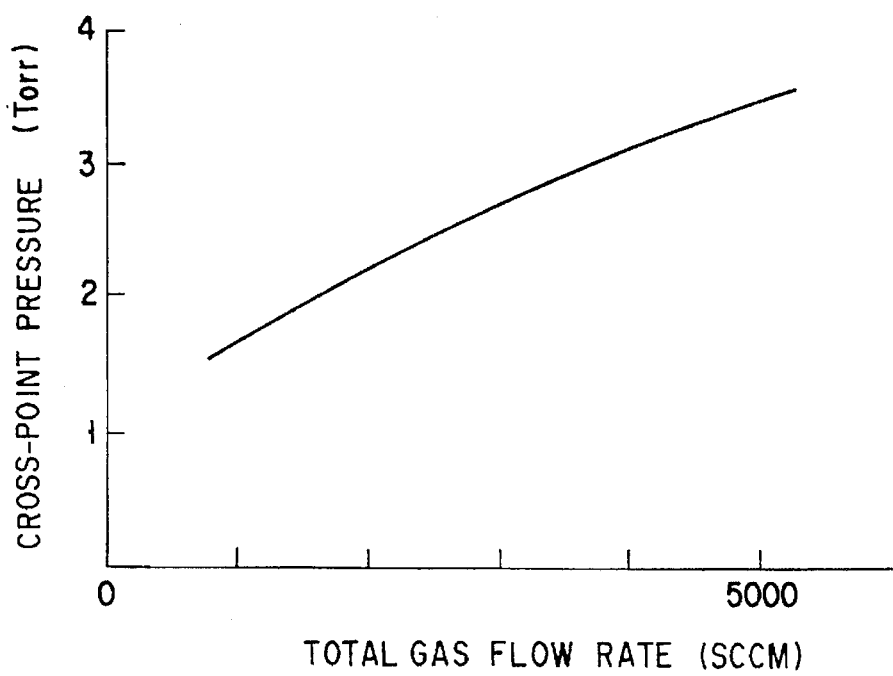
F I G. 6

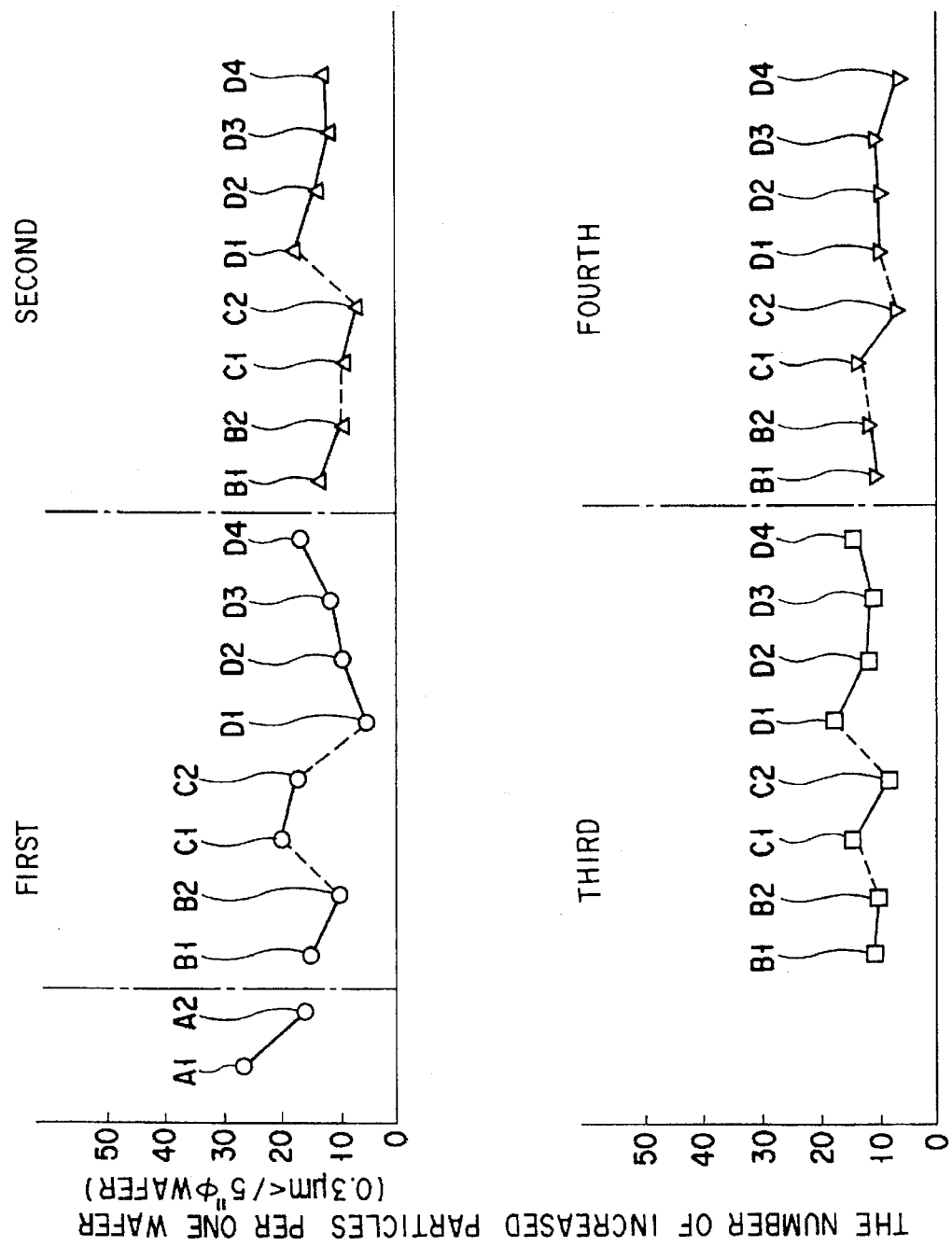
F I G. 11

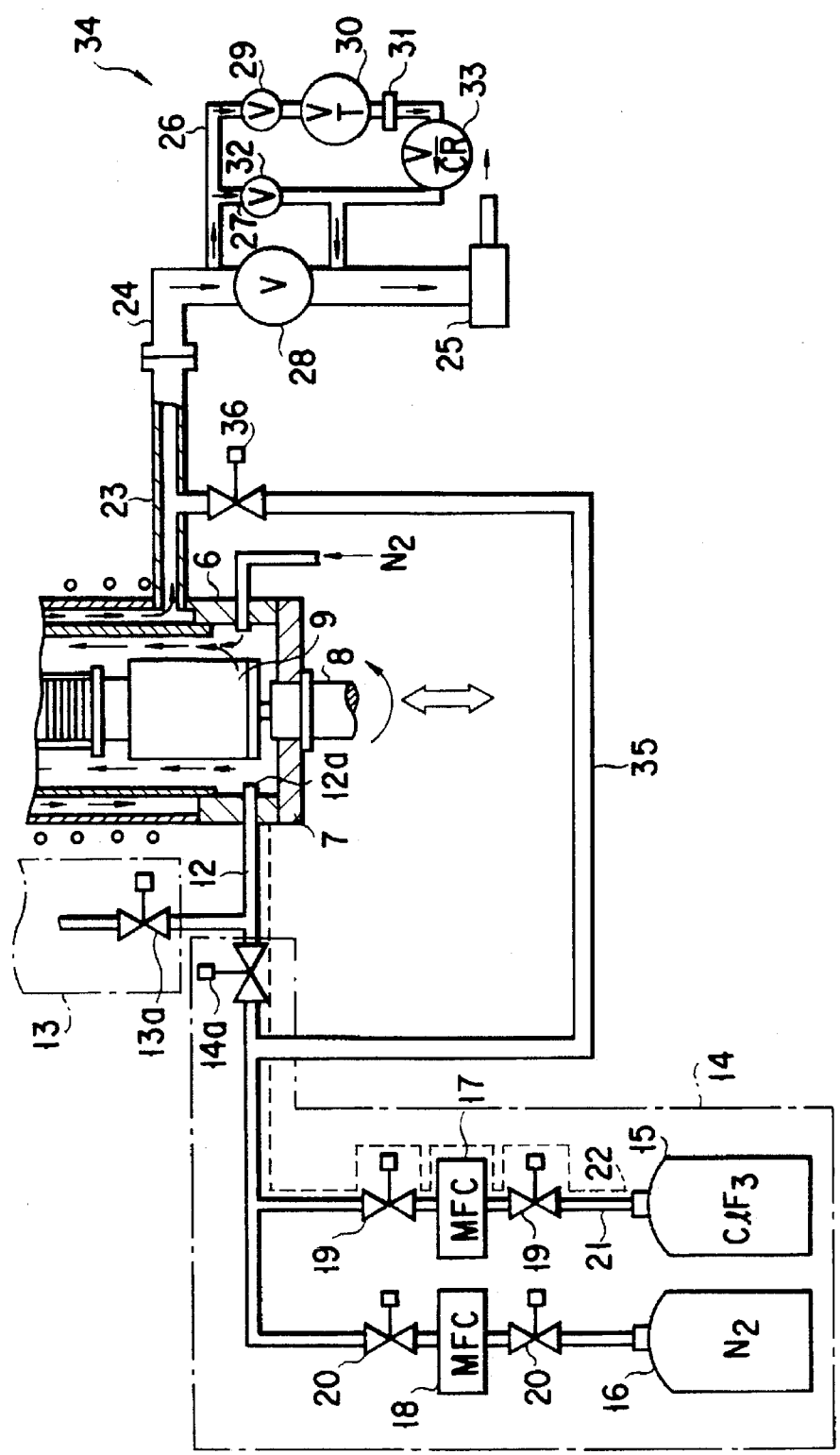
F I G. 14

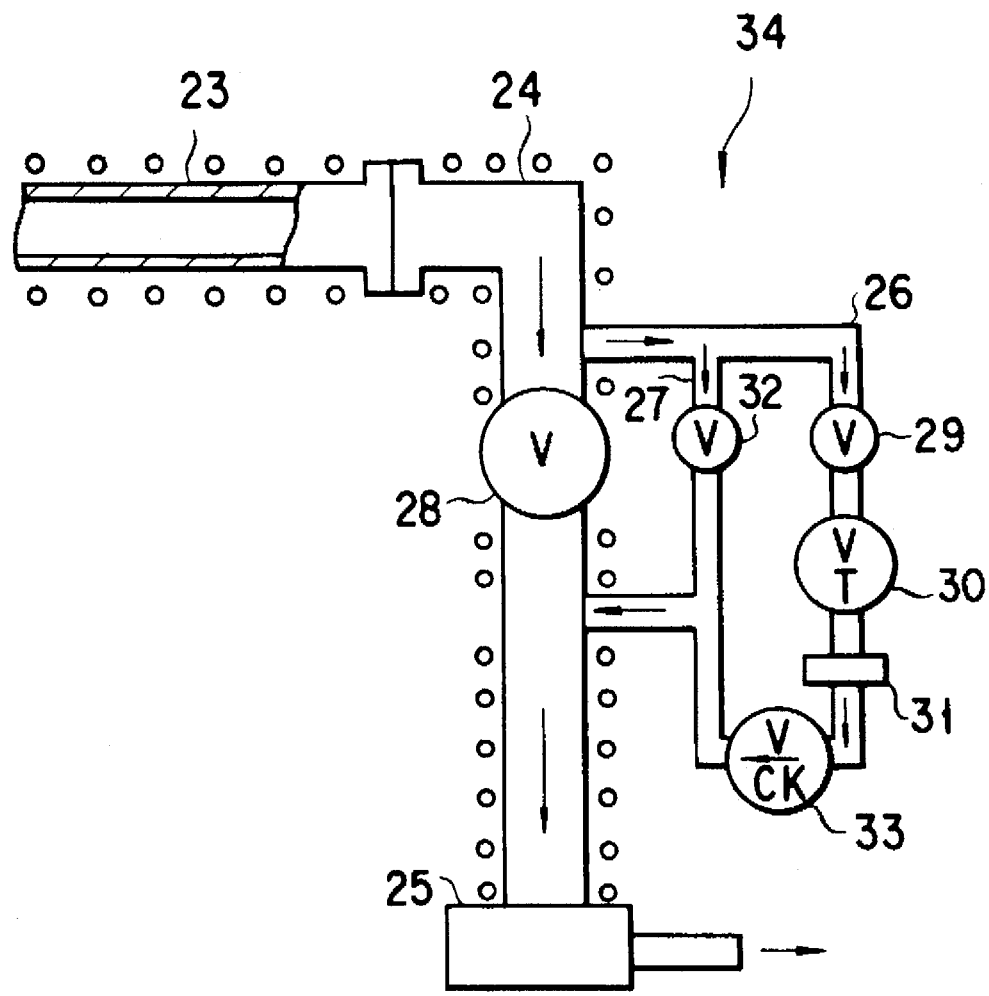
F I G. 15

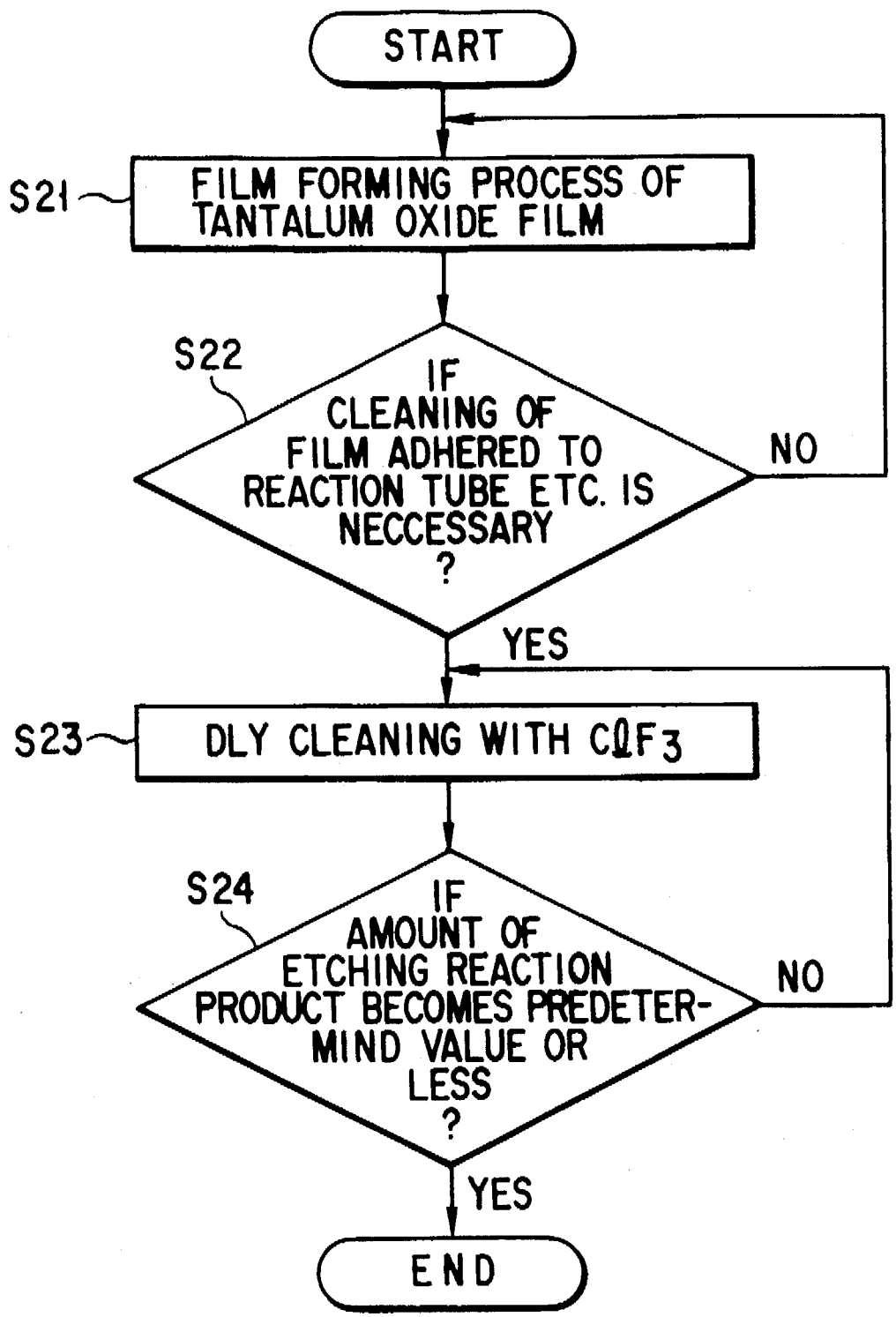
F I G. 17

5,637,153

METHOD OF CLEANING REACTION TUBE AND EXHAUSTION PIPING SYSTEM IN HEAT PROCESSING APPARATUS

CROSS-REFERENCES TO THE RELATED APPLICATIONS

This application is a continuation-in-part of U.S. patent application Ser. No. 08/336,067, filed Nov. 4, 1994, now abandoned, which is a division of U.S. patent application Ser. No. 08/054,229, filed Apr. 30, 1993, patented (U.S. Pat. No. 5,380,370 issued Jan. 10, 1995).

BACKGROUND OF THE INVENTION

1. Field of the Invention

The present invention relates to a method of cleaning a reaction tube and an exhaustion piping system in a heat treatment apparatus, and more particularly, to a cleaning method in which polysilicon, silicon nitride, and silicon oxide films deposited inside the reaction tube and the exhaustion piping system are removed by a cleaning gas containing $ClF_3$. In addition, the present invention relates to a method of forming a film on the surface of a substrate to be processed.

2. Description of the Related Art

Conventionally, in the steps of manufacturing a semiconductor device, a polysilicon-based film such as a polysilicon film or a silicon epitaxial growth film, a silicon nitride film, or a silicon oxide film is formed on a substrate to be processed such as a semiconductor wafer by low-pressure CVD, atmospheric-pressure CVD, or the like.

For example, in the step of forming a polysilicon-based film, a heat treatment apparatus constituted by arranging a heater around a reaction tube consisting of quartz or the like is generally used. For example, a wafer boat in which a large number of semiconductor wafers are stored in loaded in a reaction tube kept at a predetermined temperature, and reactive gases such as an $SiH_4$ gas, an $SiH_2Cl_2$ gas, an $Si_2H_6$ gas, and an $H_2$ gas are supplied into the reaction tube, thereby performing a film forming process of a silicon-based film. The loading/unloading operations of semiconductor wafers are generally performed to the reaction tube kept at about a process temperature.

When the above film forming process is performed, a polysilicon-based film is deposited on the reaction tube of the heat treatment apparatus or other quartz jigs. The thickness of the polysilicon-based film deposited on the reaction tube and the like is increased, it is then peeled and scattered. The scattered film pieces are adhered on semiconductor wafers. This is a factor of decreasing the yield of the semiconductor wafers. The above problem is also posed in film forming processes of a silicon nitride film and a silicon oxide film.

The film deposited inside the reaction tube is generally removed to be described below at a predetermined frequency. That is, the temperature in the reaction tube is decreased to about an atmospheric temperature, the reaction tube, the quartz members, and the like are removed, and they wet-washed with a diluted hydrogen fluoride solution to remove the deposited film.

In the method of cleaning the inside of the reaction tube according to the wet washing, however, the apparatus must be stopped for a very long time to increase/decrease the temperature in the reaction tube and to remove the reaction tube and the like. Therefore, the operational efficiency of the heat treatment apparatus is disadvantageously degraded.

A system such as a load lock system for always holding a reaction tube and a loading part in a vacuum state in a heat treatment apparatus is proposed. In this case, since the heat treatment apparatus is mostly surrounded by a vacuum chamber, an object subject to cleaned such as a reaction tube consisting of quartz cannot easily be removed from the heat treatment apparatus. In recent years, the diameter of a semiconductor wafer tends to be increased, and the size of a heat treatment apparatus is increased accordingly. In this case, since the sizes of a reaction tube main body, a quartz jig, and the like are increased, they cannot easily be removed from the apparatus to wash them. As described above, in the wet cleaning, the heat treatment apparatus must be disassembled into parts to remove objects to be cleaned. Therefore, the wet cleaning cannot easily cope with an increase in integration density of a semiconductor device and an increase in size of a wafer in recent years.

In order to solve the above problem, dry cleaning in which an etching gas flows into a reaction tube to clean the inside of the reaction tube has been attempted. According to this method, an etching gas such as a carbon tetrafluoride ($CF_4$), a nitrogen trifluoride ($NF_3$), or a sulfur hexafluoride ($SF_6$) gas is supplied to a reaction tube, and a plasma is produced in the reaction tube, so that a film deposited inside the reaction tube is removed by etching. More specifically, it has been reported that cleaning can be performed without producing a plasma by using a chloride trifluoride ($ClF_3$) gas as an etching gas.

However, as the $ClF_3$ gas has high reactivity, a material such as quartz constituting a reaction tube and a jig incorporated in the reaction tube are etched by the $ClF_3$ gas under a high-temperature condition. For this reason, $ClF_3$ has not been able to be considered to be used at a temperature of 400° C. or more, and cleaning is generally performed at a temperature of 400° C. or less. Therefore, in the film forming step under a temperature condition of 400° C. or more, and more particularly, 600° C. or more, the temperature in the reaction tube must be decreased to 400° C. or less by spontaneously radiation to perform cleaning using the $ClF_3$ gas. In addition, the temperature in the reaction tube must be reset to restart the film forming step. As a result, the cleaning requires a long time, and the operational efficiency of the heat treatment apparatus is degraded.

As described above, both the conventional wet-cleaning and dry-cleaning methods require cumbersome operations, and a long time is required to perform these methods. For this reason, the methods are not suitable for frequently performing cleaning in the film forming step to always keep the inside of the reaction tube clean. In accordance with an increase in integration density of a semiconductor device in recent years, an operation environment is required to be more clean. However, this requirement cannot be easily be achieved by the conventional cleaning methods.

Further, in the heat treatment apparatus, an exhaust piping system for exhausting an exhaustion gas outside from the reaction tube after the completion of the process, is provided. The exhaust piping system contains, e.g., a exhaust pipe, a valve or a pump. For example, if the exhaustion gas containing the reactive gases used for the above film forming process is introduced to the piping system while the exhaustion gas still having a high temperature, the film forming reaction occurs within the exhaustion piping system, and films are deposited on the inner wall or the like of the piping system. The exhaustion piping system may be plugged up by the films deposited therein. Further, films are peeled and flow back into the reaction tube, and are adhered on semiconductor wafers. This is a factor of decreasing the throughput of the semiconductor devices.

In order to avoid this, conventionally, the exhaustion piping system in which films are adhered on the inner wall thereof, is disassembled for cleaning or replacement of parts. However, once the piping system is disassembled and reassembled, it is necessary to check the leakage of gas in the piping system. Therefore, the maintenance of the heat process apparatus is complicated, and the productivity of the semiconductor devices is significantly degraded.

SUMMARY OF THE INVENTION

The object of the present invention is to provide a cleaning method of cleaning films deposited in a reaction tube and an exhaust pipe system efficiently in a short time, with safety.

The object of the invention can be achieved by a cleaning method of cleaning an interior of a reaction tube and an exhaust piping system in a heat treatment apparatus, comprising the step of:

supplying a cleaning gas containing $ClF_3$ to the interior of the reaction tube and to the exhaust pipe system connected to the interior of the reaction tube, so as to remove a film deposited on an inner wall surface of the reaction tube or a surface of a member contained in the reaction tube and on an inner surface of the exhaust piping system by etching, wherein the cleaning gas is supplied while the temperature in the reaction tube is maintained at 450° C. or higher, and in a pressure condition set at the maintained temperature such that an etching rate of the film by the cleaning gas is higher than an etching rate of a material of the reaction tube or a member incorporated in the reaction tube.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a graph illustrating relationships between etching rates for polysilicon and quartz, and gas flow rates;

FIG. 4 is a graph illustrating relationships between etching rates for polysilicon and quartz, and pressures within the reaction tube;

FIG. 5 is a graph illustrating a relationship between a cross-point pressure and a process temperature;

FIG. 6 is a graph illustrating a relationship between a cross-point pressure and a total gas flow rate;

FIG. 11 show graphs showing the numbers of increased particles per wafer in the steps of the method of forming the film shown in FIG. 10;

FIG. 14 is a schematic diagram showing a main part of another embodiment of a vertical type heat treatment apparatus in which the cleaning method for the reaction tube and piping system, according to the present invention, is applied;

FIG. 15 is a schematic diagram showing a main part of still another embodiment of a vertical type heat treatment apparatus in which the cleaning method for the reaction tube and piping system, according to the present invention, is applied;

FIG. 17 is a flowchart illustrating a sequence of a embodiment of a method of forming a tantalum oxide film according to the present invention.

DETAILED DESCRIPTION OF THE PREFERRED EMBODIMENTS

Figure 1:
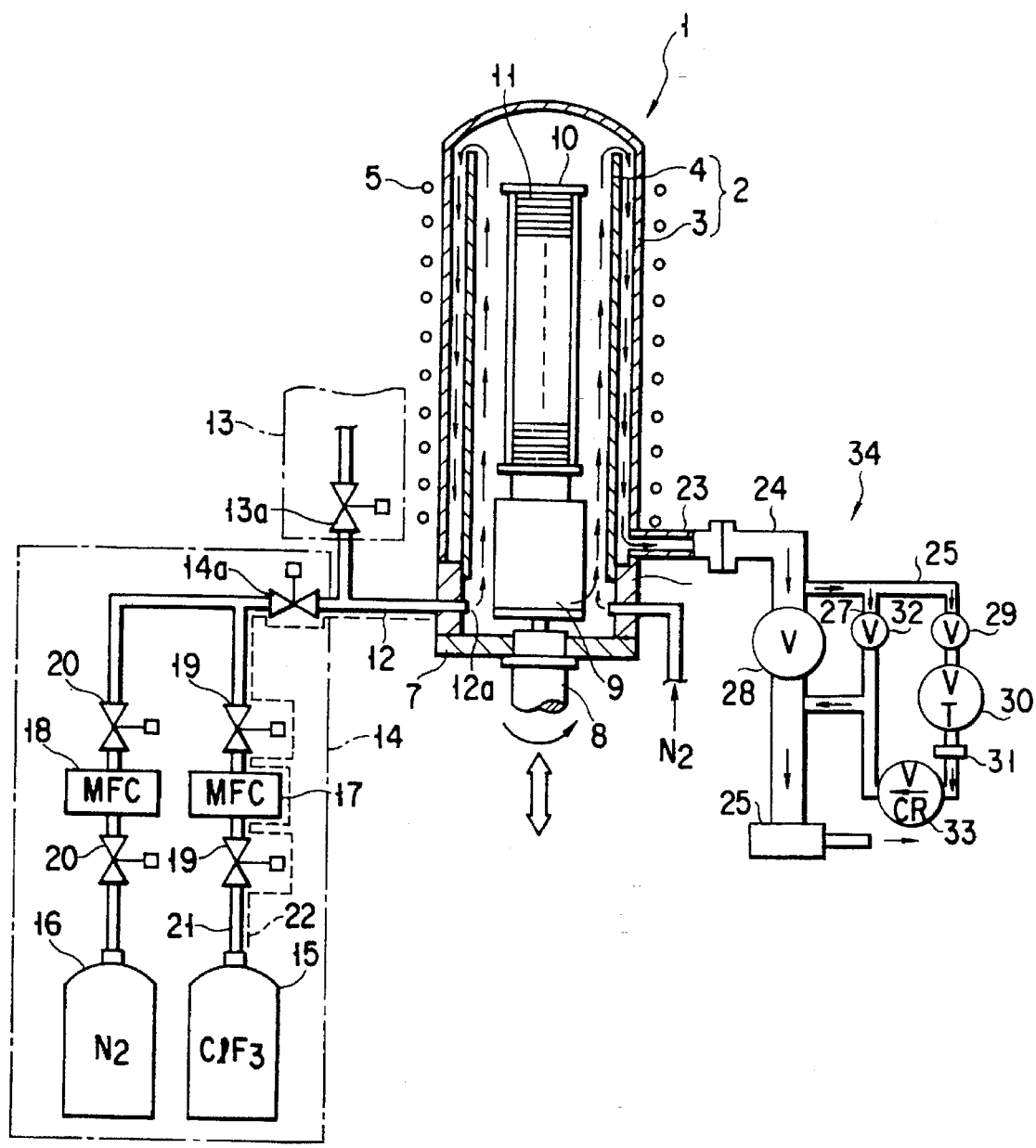
FIG. 1 is a schematic diagram showing an embodiment of a vertical type heat treatment apparatus in which the cleaning method for the reaction tube and the exhaust pipe system, according to the present invention, is applied.

An embodiment in which a method of cleaning the inside of a reaction tube and a piping system according to the present invention is applied to cleaning of a batch type vertical heat treatment apparatus will be described below with reference to the accompanying drawings.

First, the vertical heat treatment apparatus used in the present invention will be described below with reference to FIG. 1. A vertical heat treatment apparatus 1 has a reaction tube 2. The reaction tube 2 has a double structure including an outer tube 3 having an upper closed end and a lower opening end and an inner tube 4 coaxially arranged in the outer tube 3 with a predetermined interval and having upper and lower opening ends. The outer tube 3 and the inner tube 4 consist of a heat-resistant material such as quartz.

A heater 5, a heat-insulating material (not shown), and the like are arranged around the reaction tube 2 so as to surround the reaction tube 2.

The lower ends of the outer tube 3 and the inner tube 4 are supported by a manifold 6 consisting of stainless steel or the like. A disk-like cap portion 7 consisting of, e.g., stainless steel, is arranged at the lower opening end of the manifold 6 such that the lower opening end can freely be opened and closed with the cap portion 7. When the cap portion is closed, the opening of the lower end portion of the manifold 6 is air-tightly closed by the cap portion 7.

A rotating shaft 8 extends through almost the central portion of the cap portion 7. The lower end portion of the rotating shaft 8 is connected to a lifting mechanism (not shown) and a rotating mechanism (not shown).

A heat-insulating cylinder 9 is arranged on the upper surface portion of the cap portion 7, and a wafer boat 10 is mounted on the heat-insulating cylinder 9. A plurality of semiconductor wafers 11 serving as objects to be processed are stacked and stored on the wafer boat 10 at a predetermined pitch. The wafer boat 10 consists of, e.g., quartz.

The cap portion 7, the heat-insulating cylinder 9, and the wafer boat 10 are integrally loaded by the above lifting mechanism. In this manner, the heat-insulating cylinder 9 and the wafer boat 10 are stored in the reaction tube 2, and the cap portion 7 air-tightly closes the lower opening end of the manifold 6.

A gas guide pipe 12 is arranged at a predetermined portion of the side wall of the manifold 6 to cause a gas outlet end 12a to linearly extend inside the manifold 6. A source gas supply system 13 and a cleaning gas supply system 14 are connected to the outer end of the gas pipe 12 through switching valves 13a and 14a, respectively. Gases supplied to the reaction tube 2 are switched by the valves 13a and 14a.

The cleaning gas supply system 14 has a $ClF_3$ gas supply unit 15 serving as an etching gas source and an $N_2$ gas supply unit 16 for supplying an $N_2$ gas serving as a carrier gas for diluting a $ClF_3$ gas. The gas supply units 15 and 16 are connected to the gas guide pipe 12 through mass-flow controllers (MFC) 17 and 18 and valves 19 and 20, respectively. A tape heater 22 is wound around a piping system 21 of the $ClF_3$ gas supply unit 15 to prevent the $ClF_3$ gas from being liquefied again in the pipe.

A gas exhaust tube 23 is connected to a lower portion of the side wall of the reaction tube 2, and a vacuum pump 25 is connected to the exhaust tube 23 via a main exhaust pipe 24. A first sub-exhaust pipe 26 and a second sub-exhaust pipe 27 are parallely connected to the main exhaust pipe 32. The vacuum pump 25 is operated to exhaust a gas flowing downward between the inner tube 3 and the outer tube 4 of the reaction tube 3 out of the system, such that the interior of the processing tube 1 can be set in a reduced pressure atmosphere having a predetermined pressure.

A main valve 28 is arranged in the main exhaust pipe 24, and a main exhaust system having a high exhaust pressure is constituted by the main exhaust pipe 24, the main valve 28 and the vacuum pump 25.

A first sub-valve 29, a needle valve 30 and an oxygen gas concentration sensor 31 are inserted in the first sub-exhaust pipe 26, and a second sub-valve 32 is inserted in the second sub-exhaust pipe 27. A sub-exhaust system having a low exhaust pressure is constituted by the first sub-exhaust pipe 26, the second sub-exhaust pipe 27, the first sub-valve 29, the needle valve 30, the oxygen gas concentration sensor 31, the second sub-valve 32 and the vacuum pump 25. Note that the exhaust pressure of the first sub-exhaust pipe 26 can be set to be lower than that of the second sub-exhaust pipe 27 by adjusting the needle valve 30.

The oxygen gas concentration sensor 31 is a sensor of zirconia ceramics type, and the sensor measures an oxygen concentration by using an electro chemical cell of zirconia ceramics. As the oxygen gas concentration sensor 31, for example, Token TB-11C (tradename) can be used. As the oxygen gas concentration sensor, any other type can be used.

As shown in FIG. 1, the oxygen gas concentration sensor 31 is preferably arranged on the downstream side of the needle valve 30 to prevent a reaction product from being adhered inside the reaction tube 2.

Further, as shown in FIG. 1, a protection valve 33 is provided on the downstream side of the oxygen gas concentration sensor 31. The protection valve 33 can prevent the reaction product in the reaction tube 2 from reversely flowing into the first sub-valve 29.

In the above-described exhaust system 34, the gas exhaust tube 23, the main exhaust pipe 24, the first sub-exhaust pipe 26, the second sub-exhaust pipe 27 and the like are pipes.

The step of forming a polysilicon film by using the above-described vertical heat treatment apparatus 1, and the step of cleaning inside the reaction tube will now be described.

The interior of the reaction tube 2 is heated to a process temperature, for example, 450° to 650° C., preferably, 620° C., and the wafer boat 10 in which a large number of semiconductor wafers 11 each having a diameter of 5 inches are stored, is loaded in the reaction tube 2. At the same time, the reaction tube 2 is air-tightly closed by a cap portion 7.

In this state, the first sub-valve 29 of the first sub-exhaust pipe 26 is opened while the main valve 28 of the main exhaust pipe 24 and the second sub-valve 29 of the second sub-exhaust pipe 27 are closed, and the reaction tube 2 is evacuated with a low exhaust pressure while the needle valve 30 is adjusted. During this exhaust, the oxygen gas concentration of a gas supplied from the reaction tube 2 is detected by the oxygen concentration sensor 31.

In this operation, the first sub-valve 29 is open for, e.g., about 2 minutes. At this time, the pressure in the reaction tube 2 is decreased from, e.g., 760 Torr to about 500 Torr. Also, the reaction tube 2 is purged with the nitrogen gas in advance to decrease an oxygen gas concentration. As a result, the oxygen gas concentration is decreased from, e.g., 0.3% to 0.2% when there is no leak.

An exhaust pressure in the first sub-exhaust pipe 26 must be low not to raise particles in the reaction tube 2. Therefore, the exhaust pressure is preferably set to be 8 to 12 liter/min.

In the above description, when the oxygen gas concentration measured with the oxygen concentration sensor 31 is decreased to a predetermined value or less within a predetermined period of time, the second sub-valve 32 is opened, the reaction tube 2 is evacuated by using the second sub-exhaust pipe 27 with an exhaust pressure which is higher than that of the first sub-exhaust pipe 26 and lower than that of the main exhaust pipe 24.

That is, when the oxygen gas concentration in the reaction tube 2 is at the predetermined value or less after the lapse of a predetermined period of time, it is determined that substantially no oxygen gas is drawn by leakage, and the exhaust is continued with a higher exhaust pressure to rapidly evacuate the reaction tube 2.

In this case, the second sub-valve 32 is open for about 2 minutes, and the pressure in the reaction tube 1 is decreased, e.g., from about 500 Torr to about 5 Torr.

An exhaust pressure in the second sub-exhaust pipe 27 must be higher than that of the first sub-exhaust pipe 26 and must be low enough to prevent particles in the reaction tube 2 from being raised. It is preferably set to be 40 to 60 liter/min in a normal state.

When the exhaust performed by the second sub-exhaust pipe 27 is completed, the main valve 28 is opened, and the reaction tube 2 is evacuated by using the main exhaust pipe 24 with an exhaust pressure higher than that of the second sub-exhaust pipe 27.

The main exhaust pipe 24 desirably requires a high exhaust pressure to rapidly perform exhaust, and the exhaust pressure is preferably set to be 8,000 to 12,000 liter/min in a normal state.

The pressure in the reaction tube 2 is decreased, e.g., from about 5 Torr to $1\times10^{-3}$ Torr within about 10 minutes by the exhaust using the main exhaust pipe 24.

In this manner, when the exhaust of the reaction tube is completed, the heat insulating cylinder 6 and the wafer boat 10 are rotated by the motor 9, and at the same time, process gases such as a silane ($SiH_4$) gas and a phosphine ($PH_3$) gas are supplied into the reaction tube 2 through the gas supply pipe 13. The supplied process gases rise in the reaction tube 2 and are supplied to the wafer W uniformly from the upper direction of the wafers W.

With the above-described exhaust operation, the interior of the reaction tube 2 is reduced to $1\times10^{-3}$ Torr, and a source gas such an $SiH_4$ gas is supplied thereto from the gas supply pipe 12 at a predetermined flow rate. For example, while maintaining the degree of vacuum at 0.5 Torr, a polysilicon film is formed on the surface of the semiconductor wafer 11.

In order to supply the source gas, the switch valve 13a on the cleaning gas supply pipe 13 side is closed, and the switch valve 14a on the source gas supply pipe 14 side is opened.

Upon completion of the low-pressure CVD processing, the gas in the reaction tube 2 is substituted with a purge gas, e.g., an $N_2$ gas, to prepare low-pressure CVD processing for next wafers, and the pressure in the reaction tube 2 is increased to an atmospheric pressure. Thereafter, the wafer boat 10 is moved downward with a moving mechanism, and the wafer boat 10 and processed wafers W are unloaded from the reaction tube 2.

The processed wafers W on the wafer boat 10 unloaded from the reaction tube 2 are replaced with new wafers to be processed and the wafer boat 10 is loaded into the reaction tube 2 again as described above, so as to perform low-pressure CVD processing.

The above operation is a series of steps of low-pressure CVD processing when no leakage occurs. In the exhaust performed for a predetermined period of time by the first sub-exhaust pipe 27 prior to the above low-pressure CVD processing, when an oxygen gas concentration is not decreased to a predetermined value or less, an alarm is given to an operator by an alarm means such as a buzzer or an indicator lamp. When the operator confirms that the oxygen gas concentration is not decreased to the predetermined value or less within the predetermined period of time, the operator interrupts the exhaust and stops the execution of the subsequent steps as needed.

That is, in this case, an oxygen gas leaks into the reaction tube 2. For this reason, the exhaust is interrupted to inspect the states of the reaction tube 2. If the operator decides that it is necessary to prevent formation of spontaneous oxide films on the wafers W according to a result of the inspection, the subsequent operations are stopped, the reaction tube 2 is purged with a nitrogen gas again, a leakage portion is then repaired.

As described above, according to this embodiment, the first sub-exhaust pipe 26 is connected to the reaction tube 2, and the oxygen gas concentration in the reaction tube 2 is detected while the reaction tube 2 is evacuated by using the first sub-exhaust pipe 26 within a low exhaust pressure. For this reason, when leakage has occurred, it can be reliably detected.

When it is detected that an oxygen gas leaks into the reaction tube 2, an operator recognizes the leakage by the alarm means such as a buzzer or an indicator lamp. Therefore, the subsequent steps can be interrupted as needed, and low-pressure CVD processing is not performed while spontaneous oxide films are kept formed on the surfaces of the wafers W, thereby increasing a production yield.

Thereafter, the wafer boat 10 is unloaded from the reaction tube 2. At this time, the temperature in the reaction tube is kept at the temperature of the film forming process.

In the film forming step, an Si-based film is deposited inside the reaction tube 2, i.e., the inner wall surface of the outer tube 3 or the inner and outer wall surfaces of the inner tube 4. In this case, the Si-based films include a polysilicon film (poly-Si), an amorphous silicon film ($\alpha$-Si), or the like. The Si-based film is removed as follows. The reaction tube 2 is air-tightly closed by the cap portion 7, and a cleaning gas containing $ClF_3$ is supplied from the gas guide pipe 12 into the reaction tube 2 heated to a temperature of 450° C. to 650° C. The reaction tube 2 is kept at a predetermined pressure, so that the Si-based film deposited inside the reaction tube 2 is removed by etching using $ClF_3$.

In this case, the concentration of $ClF_3$ in the cleaning gas, the flow rate of the cleaning gas, and the pressure of the cleaning gas are set such that the etching rate of an Si-based film by the cleaning gas is higher than the etching rate of a material constituting the reaction tube at a portion to which the Si-based film is deposited, when the temperature in the reaction tube is set to be the process temperature, i.e. between 450° C. and 650° C. Acceptable and most preferably conditions for forming a polysilicon film and cleaning inside of the reaction tube according to the present invention will be shown in Table 1.

TABLE 1

|  | Acceptable Range | Most preferably condition |
| --- | --- | --- |
| Temperature | 450° C. to 650° C. | 620° C. |
| Pressure | 0.3 to 5 Torr (Preferably 0.5 to 2 Torr) | 1 Torr |
| Concentration of $ClF_3$ | 10 to 50 vol. % | 20 vol. % |
| Flow rate of cleaning gas* | 1500 to 7000 SCCM | 3500 SCCM |
| Cleaning Time | 50 to 150 min. | 100 min. |
| Area of Object** |  | 2.1 m² |
| Thickness of Film |  | 10 μm |

*A concentration of $ClF_3$ in a cleaning gas is 20 vol. %.
**This is a total of an inner surface area of an outer tube and an inner and outer surface area of an inner tube.

| Outer tube | |
| --- | --- |
| Inner diameter | 0.25 m |
| Length | 1 m |
| Inner surface area | 0.78 m² |
| Inner tube | |
| Inner diameter | 0.21 m |
| Length | 1 m |
| Inner and Outer surface area | 1.32 m² |
| Total | 2.1 m² |

The conditions shown in Table 1 will be described in detail below.

Figure 2:
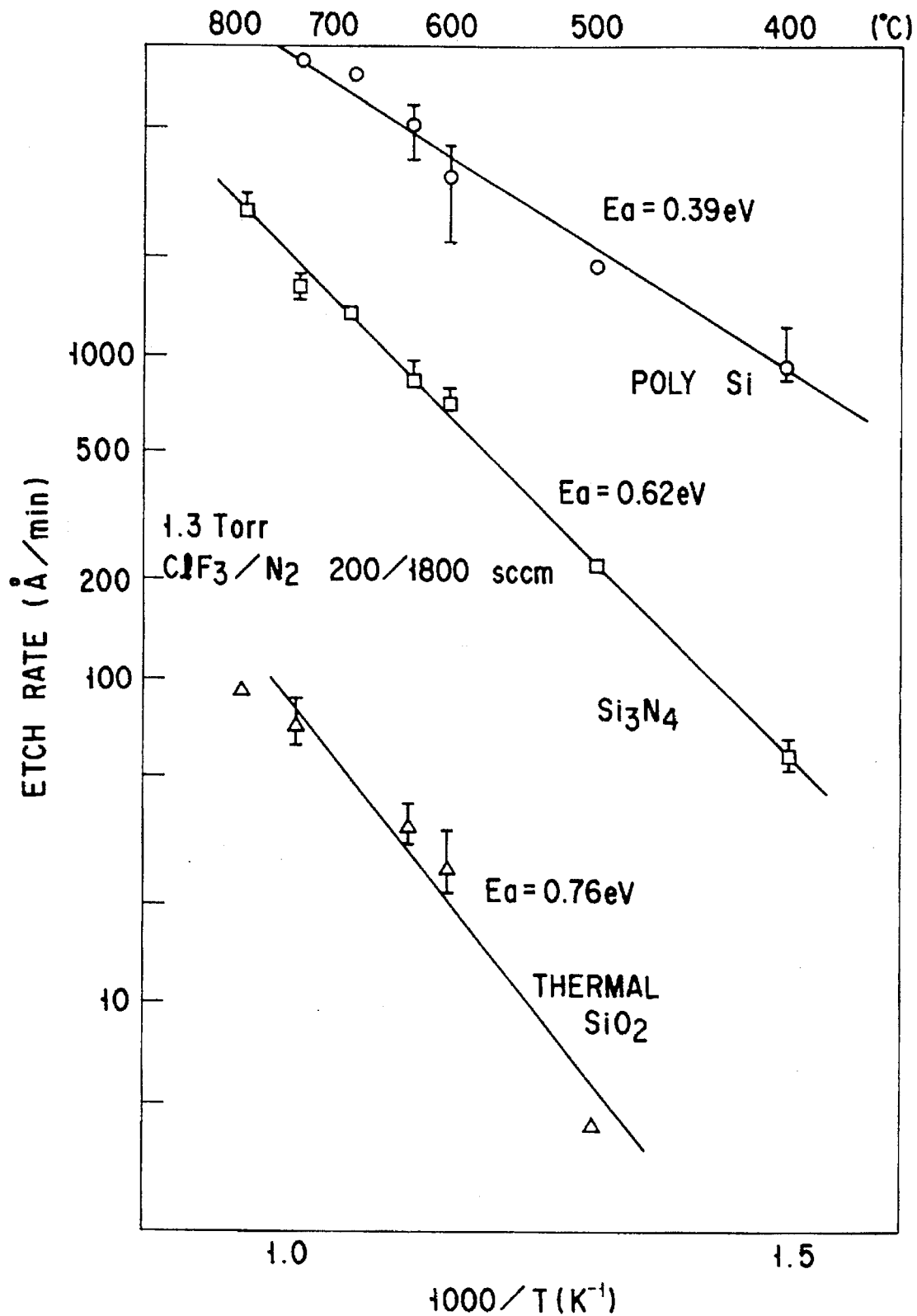
FIG. 2 is a graph illustrating relationships between etching rates for polysilicon, silicon oxide and silicon nitride and temperatures.

First, as the cleaning gas, a gas obtained by diluting a $ClF_3$ gas with, e.g., a charge gas such as an $Ar_2$ or $N_2$ gas is used. FIG. 2 shows relationships between temperatures and the etching rates of poly-silicon (poly-Si), $Si_3N_4$, and $SiO_2$ when cleaning is performed at a pressure of 1.3 Torr by using a cleaning gas containing $ClF_3$ having a concentration of 10 vol %. As is apparent from FIG. 2, when the concentration of $ClF_3$ is less than 10 vol %, the etching rate of the Si-based film is too low at the process temperature. On the other hand, when the concentration exceeds 50 vol %, the material (e.g. quartz) consisting the reaction tube 2 and the like is etched to be damaged. The concentration of $ClF_3$ is most preferably set to be 20 vol %.

The concentration of $ClF_3$ can be adjusted such that the flow rates of $ClF_3$ and $N_2$ gases are properly set by the MFCs 17 and 18 prior to a cleaning process.

Second, the total flow rate of the cleaning gas is dependent on the concentration of $ClF_3$ in the cleaning gas, the surface area inside the reaction tube 2, the thickness of the film and the condition of depositing the film. FIG. 3 shows relationships between gas flow rates and the etching rates of polysilicon and quartz. In this case, the concentration of $ClF_3$ in the cleaning gas is 10 vol %, the temperature in the reaction tube 2 is 620° C., and the pressure in the reaction tube is 1 Torr.

Third, FIG. 4 shows relationship between pressures and the etching rates of polysilicon and quartz. In this case, the concentration of $ClF_3$ in the cleaning gas is 20 vol %, the temperature in the reaction tube 20 is 620° C., and the total flow rate of the cleaning gas is 3,500 SCCM [700/2,800 $ClF_3/N_2$ (SCCM/SCCM)]. As is apparent from FIG. 4, the etching rate of quarts is 10 increased in proportion to an increase in pressure. In contrast to this, the etching rate of polysilicon is in inverse proportion to the pressure. Therefore, when a cleaning process is performed at a pressure lower than a pressure (to be referred to as a cross-point pressure hereinafter) (2.5 Torr in FIG. 4) at which the etching rate of quartz is equal to the etching rate of polysilicon, a polysilicon film deposited inside the reaction tube 2 can be removed by etching using $ClF_3$ without damaging the quartz constituting the reaction tube 2. From this point of view, the pressure in the reaction tube 2 in the cleaning process at the above process temperature is set to be 0.3 to 5.0 Torr, preferably, 0.5 to 2 Torr, and more preferably, 1 Torr, as shown in the Table 1.

However, the above cross-point pressure is changed depending on the temperature in the reaction tube 2, the concentration of $ClF_3$ in the cleaning gas, and the total flow rate of the cleaning gas. When the same conditions as described above are used except that the temperature in the reaction tube 2 is changed, a relationship between the cross-point pressure and the temperature is shown in FIG. 5. When the same conditions as described above are used except that the total flow rate of the cleaning gas is changed, a relationship between the cross-point pressure and the gas flow rate is shown in FIG. 6. As is apparent from FIG. 5, the cross-point pressure is in inverse proportion to the temperature in the reaction tube 2. As is apparent from FIG. 6, the cross-point pressure is in proportion to the total flow rate of the cleaning gas. The cross-point pressure is also influenced by the discharging ability of the vacuum pump 24. Therefore, the cleaning process is preferably performed such that the pressure is adjusted within the above range in consideration of these other factors.

Fourth, the processing time of the cleaning process (described as "cleaning time" below) is dependent on the concentration of $ClF_3$ in the cleaning gas, the flow rate of the cleaning gas, the surface area inside the reaction tube 2, the thickness of the film and the condition of the film deposited. when the conditions excepted from the cleaning time are the same as that shown in Table 1, the cleaning time can be selected in a range between 50 min. and 150 min. according to a size of the reaction tube 2, its material, a condition of the film forming process or the like. For example, under the most preferable condition as shown in Table 1, substantially all of the film deposited inside the reaction tube 2 can be removed by performing the cleaning process for 100 min.

The cleaning gas is supplied into the reaction tube 2 such that the switching valve 14a of the cleaning gas supply system 14 and the switching valve 13a of the source gas supply system 13 is set in open state and a closed state, respectively. At this time, since the gas outlet end 12a of the gas guide pipe 12 is arranged to linearly extend from the side wall surface of the manifold 6 toward the central axis of the inner tube 4 of the reaction tube 2, the supplied cleaning gas collides against the heat-insulating cylinder 9, the turbulent flow of the cleaning gas is formed in the reaction tube 2, and a portion opposite to the gas guide pipe 12 can be sufficiently cleaned.

For example, the following structure may be used. That is, the gas guide pipe 12 is bent upward to stand in the reaction tube 2, and a plurality of gas output ports are formed along the longitudinal direction of the standing pipe, so the cleaning gas can be uniformly supplied to each wafer.

Further, the cleaning gas may be continuously or intermittently supplied.

The cleaning gas containing $ClF_3$ is supplied into the reaction tube 2 under the above conditions to perform cleaning of the inside of the reaction tube 2. In this case, the Si-based film (i.e., the polysilicon film) deposited inside the reaction tube 2, e.g., the inner wall surface of the outer tube 3 and the inner and outer peripheral surfaces of the inner tube 4, can be removed at a sufficient etching rate without damaging quartz constituting the outer tube 3 and the inner tube 4. In addition, the cleaning can be performed while the temperature in the reaction tube is kept at a temperature of 450° C. to 650° C. which is the temperature of the film forming process of a polysilicon film. For this reason, in shifting the film forming step to the cleaning step or shifting the cleaning step to the new film forming step, the temperature in the reaction tube 2 need not be increased and decreased. Therefore, a time required for the cleaning can be considerably decreased, and the operational efficiency of the heat treatment apparatus can be considerably improved. In addition, the cleaning process can be performed by etching using $ClF_3$ without producing a plasma.

Cleaning of the inside of the reaction tube 2 to remove a silicon-nitride-based film deposited inside the reaction tube 2 in the step of forming a silicon nitride film using the above vertical heat treatment apparatus 1 will be described below.

A film forming process of silicon nitride films on the surfaces of the wafers 11 is performed under the following conditions. For example, a source gas containing such as $SiH_4$, $SiH_2Cl_2$, and $NH_3$ is used, the temperature in the reaction tube 2 is 600° C. to 850° C., and the internal pressure in the reaction tube 2 is $1\times10^{-1}$ Torr. Other process operations are the same as those of the step of forming polysilicon as described above. Most preferably, the step of forming a silicon nitride film is performed under the following conditions. That is, a process temperature is 780° C., a pressure is 0.4 Torr, and a source gas containing $SiH_2Cl_2$ and $NH_3$ are supplied at a flow rate ratio of 90/900 $SiH_2Cl_2/NH_3$ (SCCM/SCCM).

In the same manner as described above, under the following conditions, a cleaning process of the inside of the reaction tube 2 is performed to remove a film deposited inside the reaction tube 2 in the step of forming a silicon nitride film.

Acceptable and most preferable conditions of a cleaning process in a film forming process according to the present invention will be shown in Table 2.

TABLE 2

|  | Acceptable Range | Most Preferably condition |
|---|---|---|
| Temperature | 550° C. to 650° C. | 620° C. |
| Pressure | 0.3 to 5 Torr (preferably 0.5 to 2 Torr) | 1 Torr |
| Concentration of $ClF_3$ | 10 to 50 vol. % | 20 vol. % |
| Flow rate of cleaning gas* | 1500 to 7000 SCCM | 3500 SCCM |
| Cleaning Time | 35 to 110 min. | 100 min. |
| Area of Object** | | 2.1 m$^2$ |
| Thickness of Film | | 10 μm |

*A concentration of $ClF_3$ in a cleaning gas is 20 vol. %.
**This is a total of an inner surface area of an outer tube and an inner and outer surface area of an inner tube.

The conditions shown in Table 2 will be described in detail below.

The temperature in the reaction tube 2 is set to be a temperature relatively lower than the above film forming process temperature, 600° C. to 850° C., that is, more specifically, 550° C. to 650° C. As is apparent from FIG. 2, when the concentration of $ClF_3$ in the cleaning gas is 10 vol %, an etching rate enough to etch the silicon nitride film cannot be obtained at a temperature lower than 550° C. On the other hand, when the temperature exceeds 650° C., the etching rate of quartz constituting the reaction tube 2 and the like is increased, thereby damaging the reaction tube 2 and the like.

The concentration of $ClF_3$ in the cleaning gas is determined within a range set such that, as in the above removal of the Si-based film, an etching rate enough to etch the silicon nitride film can be obtained at the temperature (550° C. to 650° C.) of the cleaning process and a material (e.g. quartz) constituting the reaction tube 2 and the like is not damaged by etching. More specifically, the concentration of $ClF_3$ falls within the range of 10 to 50 vol % and more preferably, 20 vol %.

The total flow rate of the cleaning gas, as in the above removal of the Si-based film, is dependent on the concentration of $ClF_3$ in the cleaning gas, the surface area inside the reaction tube 2, the thickness of the film and the condition of the film deposited.

The pressure in the reaction tube 2 during the cleaning process, as in the removal of the Si-based film, is set such that the etching rate of a silicon nitride film is higher than the etching rate of quartz. That is, the cleaning process is performed at a pressure lower than the cross-point pressure. However, the cross-point pressure is changed depending on the temperature in the reaction tube 2, the concentration of $ClF_3$ in the cleaning gas and the total flow rate of the cleaning gas. In addition, the cross-point pressure is also influenced by the discharging ability of the vacuum pump 24. Therefore, the cleaning process is preferably performed such that the pressure is adjusted within the above range in consideration of the these factors.

The cleaning time is dependent on the concentration of $ClF_3$ in the cleaning gas, the flow rate of the cleaning gas, the surface area inside the reaction tube 2, the thickness of the film and the condition of the film deposited. When conditions except from the cleaning time are the same as that shown in Table 2, the cleaning time can be selected in a range between 35 min. and 110 min. according to a size of the reaction tube 2, its material, a condition of the film forming process or the like. For example, under the most preferable condition as shown in Table 2, substantially all of the film deposited inside the reaction tube 2 can be removed by performing the cleaning process for 70 min.

When the cleaning process is performed under the above process conditions, a silicon-nitride-based film (i.e. polysilicon nitride film) deposited inside the reaction tube 2 can be removed at a sufficient etching rate without damaging quartz constituting the reaction tube and the like. When the temperature in the reaction tube 2 is slightly increased or decreased from the process temperature of 550° C. to 650° C. in the film forming process of a silicon nitride film, the cleaning process can be performed. For this reason, in shifting the film forming step to the cleaning step or shifting the cleaning step to the new film forming step, the temperature in the reaction tube 2 can be increased and decreased for a short time. Therefore, a time required for cleaning can be considerably shortened, and the operational efficiency of the heat treatment apparatus 1 can be remarkably increased.

Cleaning for removing a silicon oxide film deposited inside the reaction tube 2 in the step of a silicon oxide film using the vertical heat treatment apparatus 1 will be described below.

Silicon oxide films are formed on the surfaces of the wafers 11 under the following conditions. For example, a source gas containing such as $SiH_4$, $SiH_2Cl_2$, $O_2$, $N_2O$ and alkoxysilane ($Si(OC_2H_5)_4$) is used, the temperature in the reaction tube 2 is 400° C. to 850° C., and the pressure in the reaction tube 2 is 1.0 Torr.

Other process operations are the same as those of the step of forming polysilicon.

In the step of forming the silicon oxide film, a cleaning process for removing a silicon-oxide-based film deposited inside the reaction tube 2 as in the removal of the Si-based film is performed.

The temperature in the reaction tube 2 is set to be 450° C. or more, preferably, 620° C. because of the following reaction. That is, as is apparent from FIG. 2, when the concentration of $ClF_3$ in the cleaning gas is 10 vol %, and etching rate enough to etch the silicon-oxide-based film cannot be obtained at a temperature lower than 450° C.

The concentration of $ClF_3$ in the cleaning gas is determined within a range set such that an etching rate enough to etch the silicon-oxide-based film is obtained at the process temperature (450° C. or more) of the cleaning process and the material constituting the reaction tube 2 and the like is not damaged by etching.

More specifically, the concentration is set within the range of 10 to 50 vol %, and more specifically, 20 vol %.

The cleaning process can be performed such that the total flow rate of the cleaning gas, as in the removal of the Si-based film, is set within the range, preferably, 3000 to 3500 SCCM, and more preferably, 3500 SCCM.

The pressure in the reaction tube 2 during the cleaning process, as in the removal of the Si-based film described above, is set such that the etching rate of the silicon oxide film is higher than that of quartz. That is, the cleaning process is performed at a pressure lower than the cross-point pressure. More specifically, the pressure in the reaction tube 2 during the cleaning process at the above process temperature is set to be 5.0 Torr or less and more preferably, 1 Torr.

However, the cross-point pressure is changed depending on the temperature in the reaction tube 2, the concentration of ClF$_3$ in the cleaning gas, and the total flow rate of the cleaning gas. The cross-point pressure is also influenced by the discharging ability of the vacuum pump 24. Therefore, the cleaning process is preferably performed by adjusting the pressure within the above range in consideration of these factors.

Figure 7:
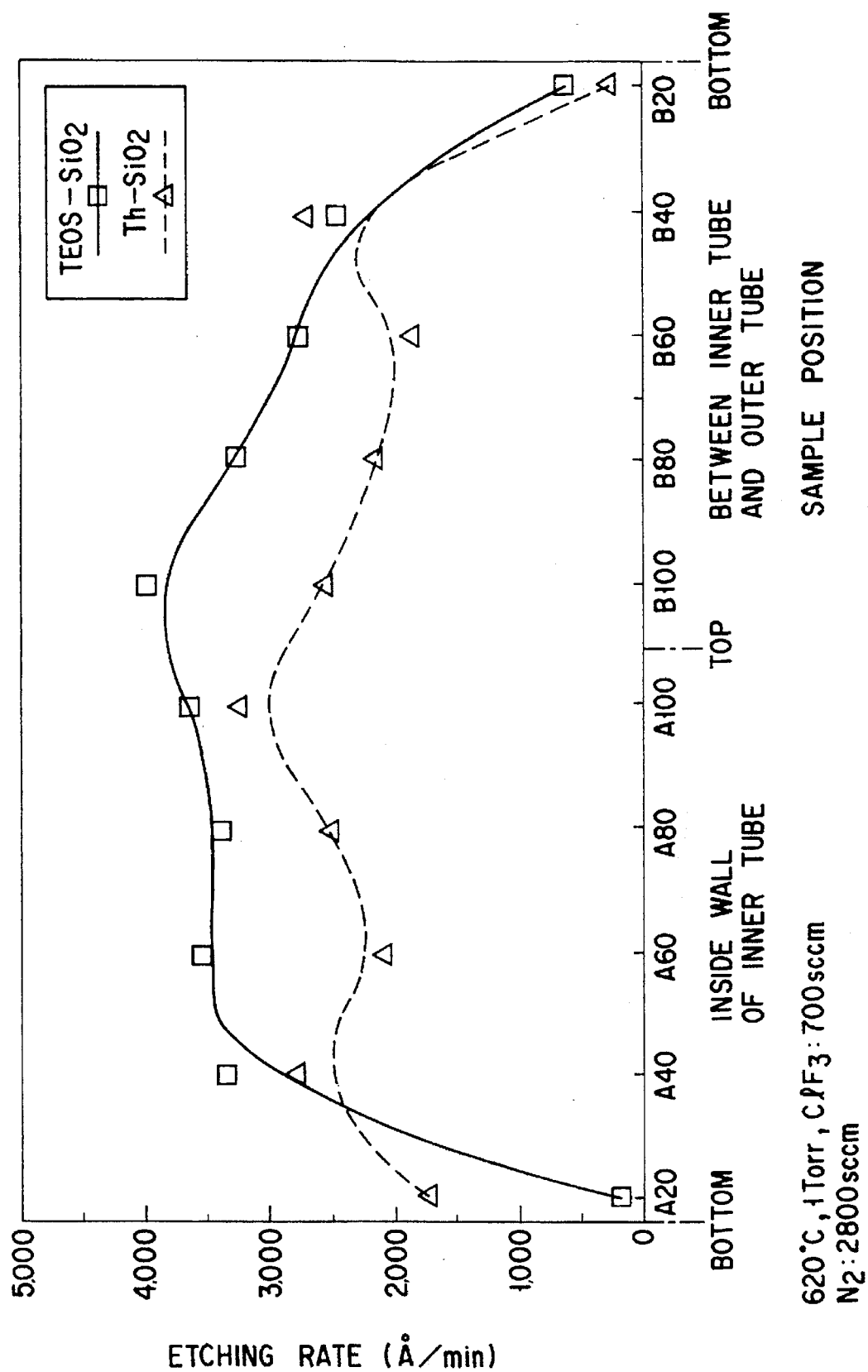
FIG. 7 is a graph illustrating a relationship between an etching rate of silicon oxide and a position in the reaction tube.
Figure 8:
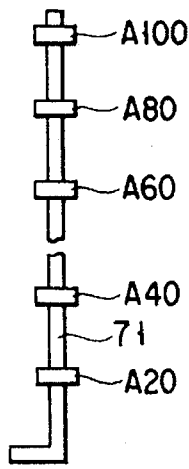
FIG. 8 is a schematic diagram showing a quartz rod used in the test of the embodiment.

FIG. 7 shows a dependency of the etching rate of silicon oxide on a position in the reaction tube. An example from which the results of FIG. 7 were obtained was performed as follows. That is, test piece wafers A20 to A100 on which silicon oxide films serving as samples were respectively formed were arranged at predetermined intervals, for example, 20 cm, on each of quartz rods 71 each having a bent low end portion and a height almost equal to the reaction tube, e.g., a rod having a height of 100 cm as shown in FIG. 8, these rods 71 were arranged on the inner wall of the inner tube 4 and in the space between the inner tube 4 and the outer tube 3, and a cleaning gas flowed in the reaction tube. At this time, cleaning conditions were set as follows. That is, the temperature in the reaction tube 2 was set to be about 620° C., the pressure was set to be about 1.0 Torr, the cleaning gas was obtained by mixing a ClF$_3$ gas at 700 SCCM and N$_2$ gas at 2800 SCCM with each other, and the concentration of was set to be about 20 vol %. A cleaning operation was performed for 1 minute. As silicon-oxide-based films serving as the samples, both a Th-SiO$_2$ film formed by thermal oxidation and a TEOS-SiO$_2$ film formed by CVD using alkoxysilane were used.

According to FIG. 7, etching rates of 2000 to 4000 Å/min were obtained at all the positions except for the reaction tube position A20 at the lower end portion of the tube. More specifically, the etching rate of TEOS-SiO$_2$ was 3000 to 4000 Å/min. This rate is considerably higher than an etching rate obtained when a conventional NF$_3$ gas is used. In this manner, it was found that a cleaning operation could be efficiently performed by using a ClF$_3$ gas as a cleaning gas for a silicon-oxide-based film.

In this example, although the ClF$_3$ gas is diluted with an N$_2$ gas to obtain a ClF$_3$ gas having a concentration of 20 vol %, this concentration may properly be changed.

As described above, when a cleaning operation for removing a silicon-oxide-based film is to be performed using a ClF$_3$ gas, the cleaning operation can be performed such that the temperature in the reaction tube 2 is set almost equal to the temperature, e.g., about 620° C., of film forming process of a silicon-oxide-based film on a semiconductor wafer. For this reason, in shifting the film forming step to the cleaning step, the temperature in the reaction tube need not be largely increased or decreased. In this case, even when the temperature in the reaction tube is increased or decreased, since the increase/decrease in temperature is small, both the steps are continuously performed.

Figure 9:
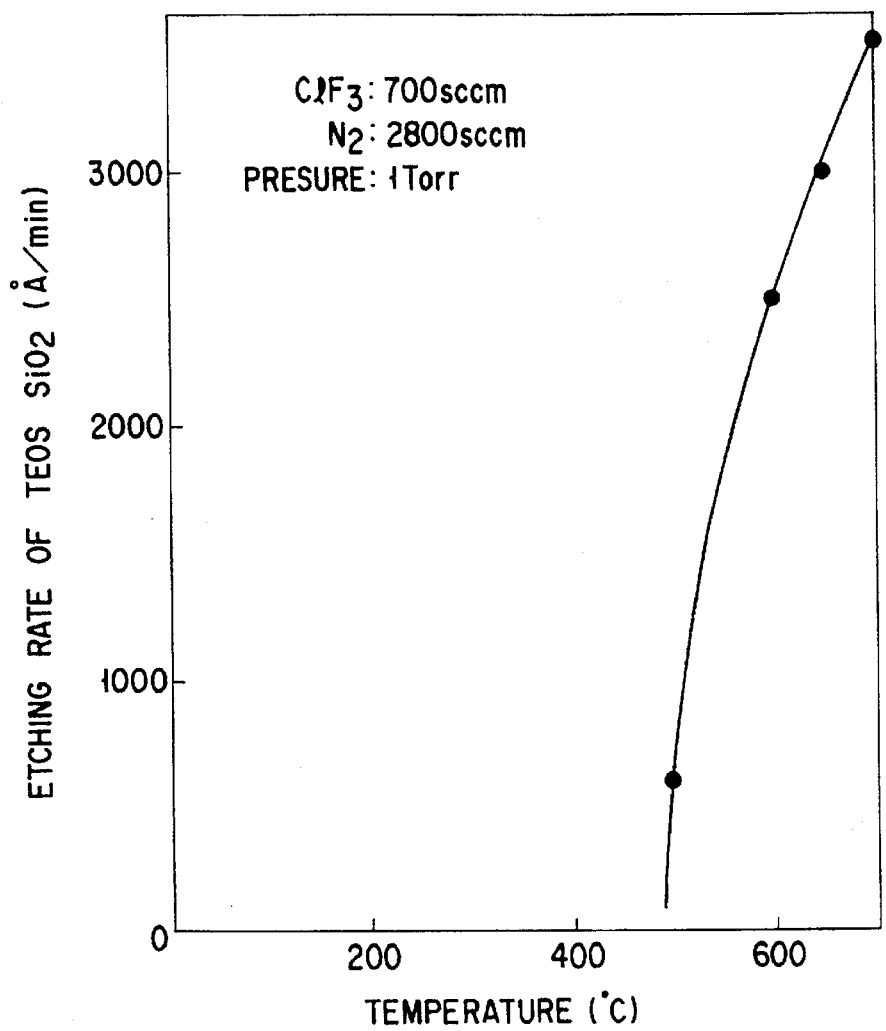
FIG. 9 is a graph illustrating a relationship between an etching rate for $TEOS-SiO_2$ and a process temperature.

FIG. 9 shows a relationship between a temperature and an etching rate of when a cleaning process is performed such that a ClF$_3$ gas and an N$_2$ gas flow at flow rates of 700 SCCM and 2800 SCCM, respectively, to keep the pressure in the reaction tube at 1 Torr. An etching rate of 600 Å/min can be obtained at a temperature of 500° C. However, at a temperature of 400° C., an etching rate is too small to be practically used. Therefore, the temperature of 450° C. or more is preferable.

In the above embodiments, cases wherein the present invention are applied to a film forming process have been described. The present invention can also be applied to a case wherein a film is deposited inside a process tube by, e.g., an etching process, an ashing process, or the like.

Results obtained by evaluating damages to the reaction tube 2 and the like caused by the above cleaning method will be described below.

A quartz jig on which a polysilicon film having a thickness of 10 μm was formed as sample was subjected to cleaning for 120 minutes in a furnace using a cleaning gas (carrier gas: N$_2$) having a concentration adjusted to 20 vol % of ClF$_3$. The inside of the furnace was heated to 630° C., and the pressure in the furnace was 1.3 Torr. In this manner, the polysilicon film could be almost completely removed, and a decreased in thickness of the quartz jig was 6 to 10 μm. In addition, the quartz jig surface became rarely roughened. It was found that the reaction tube and the like were rarely damaged by the cleaning process.

A quartz jig on which a silicon nitride film having a thickness of 5 μm was formed as sample was subjected to cleaning for 80 minutes in a furnace using a cleaning gas (carrier gas: N$_2$) having a concentration adjusted to 20 vol %. The inside of the furnace was heated to 630° C., and the pressure in the furnace was 1.5 Torr. In this manner, the polysilicon film could be almost completely removed, and a decrease in thickness of the quartz jig was 6 to 7 μm. In addition, the quartz jig surface became rarely roughened. It was found that the reaction tube and the like were rarely damaged by the cleaning process.

Figure 10:
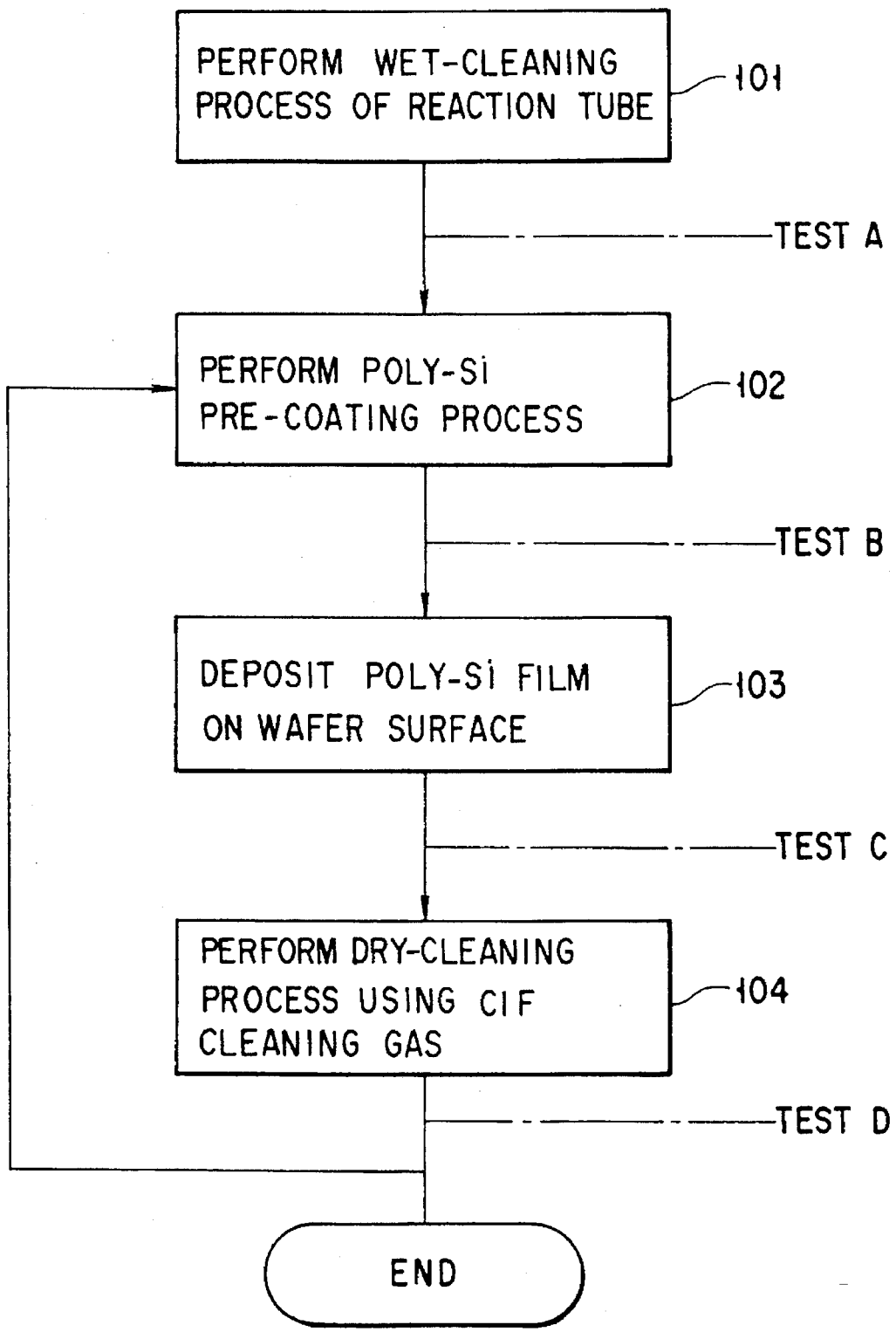
FIG. 10 is a flowchart illustrating a sequence of an embodiment of a method of forming a film according to the present invention.
Figures 12A, 12B, 12C:
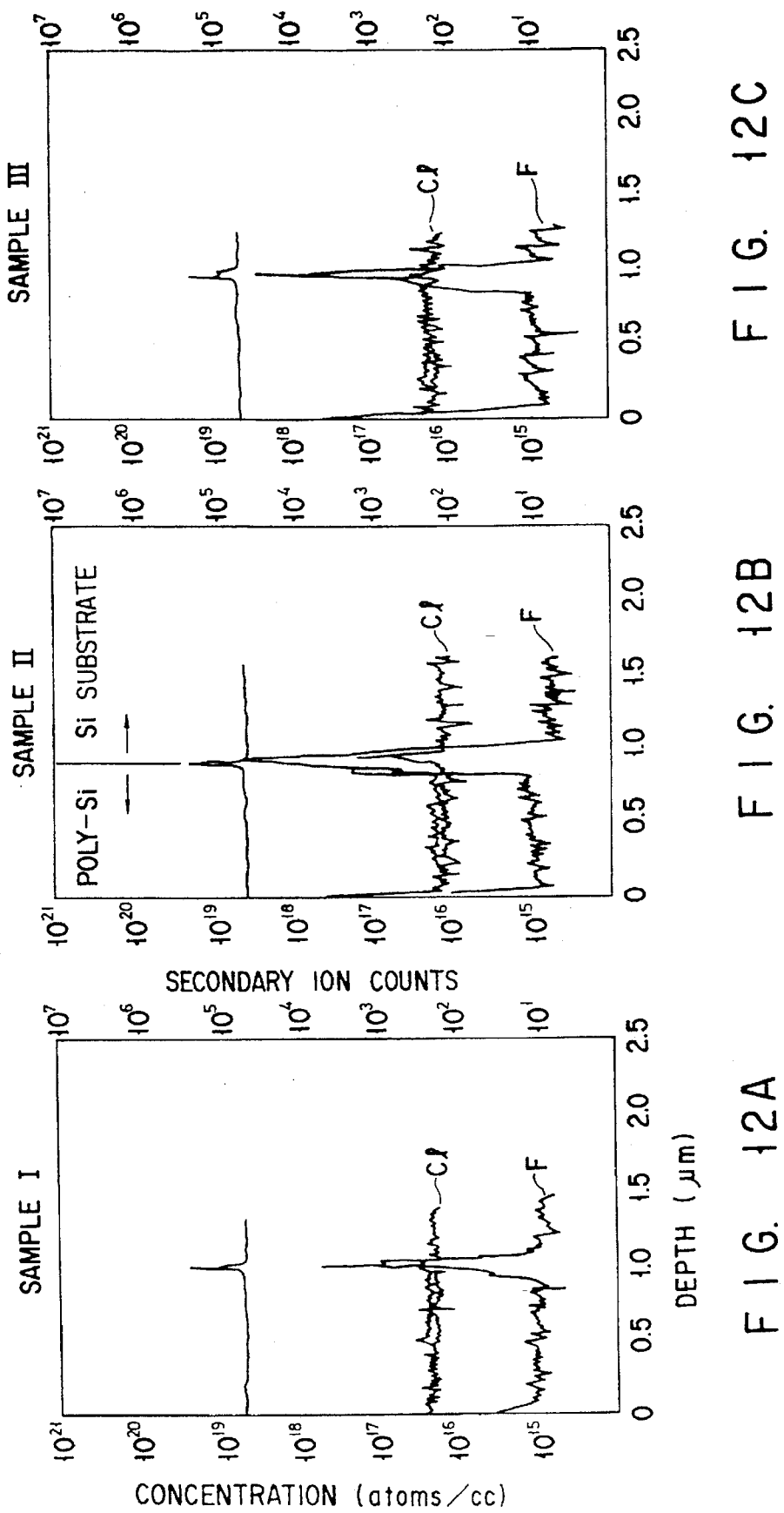
FIG. 12A to 12C are graphs respectively showing amounts of impurity in a polysilicon film formed on a wafer surface before and after a cleaning process is performed.
Figures 13A, 13B, 13C:
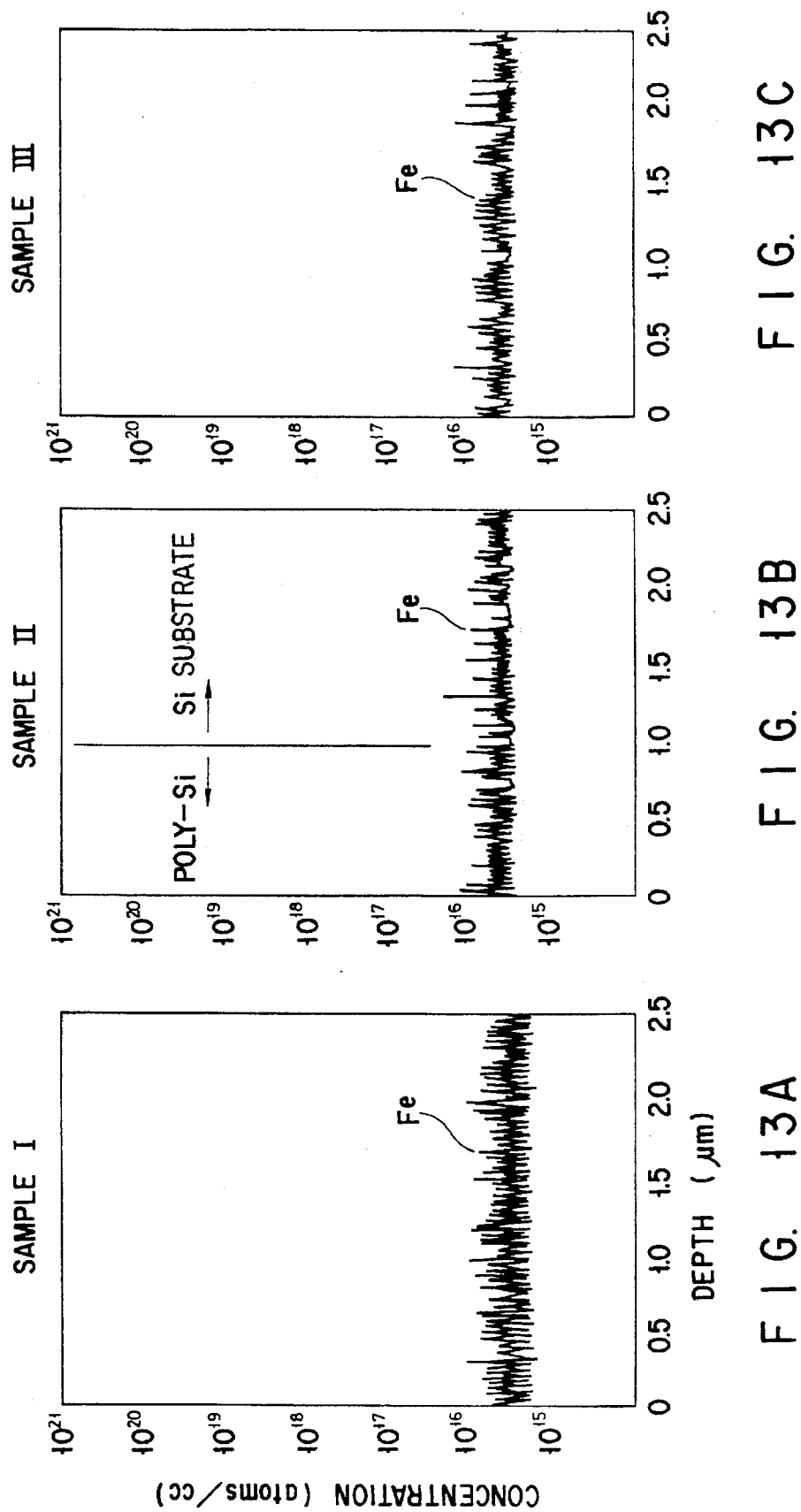
FIG. 13A to 13C are graphs respectively showing amounts of impurity in a polysilicon film formed on a wafer surface before and after a cleaning process is performed.

Dust produced in the film forming process to which a cleaning process was applied was evaluated. In this test, the following film forming process and the following cleaning process were performed in accordance with the flow chart shown in FIG. 10.

(i) A reaction tube consisting of quartz was cleaned by a diluted hydrogen fluoride (HF) solution (101).

(ii) A wafer boat in which cleaned 5-inch bare wafers were set at the lower, middle, and upper portions of the wafer boat was loaded in the reaction tube, an idle process was performed using an N$_2$ gas, and the wafer boat was unloaded. In this state, the number of particles each having a diameter of 0.3 μm or more and deposited on the surface of one bare wafer was counted. The average value of the numbers of particles each having a diameter of 0.3 μm or more and deposited on the surfaces of three bare wafers which were not subjected to the idle process was used as an initial value, and differences between the initial value and counted values were calculated as the numbers of increased particles (test A). The idle process was performed under the following conditions: a process temperature, 630° C.; a pressure in the reaction tube, 1.3 Torr; a process time, 30 minutes; and the flow rate of an N$_2$ gas, 1000 SCCM. The test was repeated twice. The obtained results are indicated by A$_1$ and A$_2$ in FIG. 11, respectively.

(iii) The wafer boat was not loaded, and the inside of the reaction tube, i.e., the inner wall surface of the outer tube or the inner and outer wall surfaces of the inner tube, was coated with a polysilicon film having a thickness of 0.6 μm (102). This polysilicon film is called a pre-coat film. This pre-coat film was formed under the following conditions: a process temperature, 620° C.; a pressure in the reaction tube, 1 Torr; a film forming process time, 100 minutes; and a source gas flow rate SiH$_4$, 200 SCCM.

(iv) In accordance with the same procedure as that of test A, the numbers of increased particles on the bare wafer surfaces were counted (test B). This test was repeated twice. The obtained results are indicated by B$_1$ and B$_2$ in FIG. 11.

(v) The wafer boat in which a plurality of wafers were set was loaded in the reaction tube, and a polysilicon film having a thickness of 10 μm was formed on each of the surfaces of the wafers (103). The polysilicon film was formed under the following conditions: a process temperature, 620° C.; a pressure in the reaction tube, 1 Torr; a film forming process time, 100 minutes; and a source gas flow rate $SiH_4$, 120 SCCM.

(vi) After the wafer boat was unloaded, the numbers of increased particles on the bare wafer surfaces were calculated in accordance with the same procedure as that of test A (test C). This test was repeated twice, and the obtained results are indicated by $C_1$ and $C_2$ in FIG. 11.

(vii) Subsequently, cleaning of the inside of the reaction tube was performed under the following conditions: a process temperature, 630° C.; a pressure in the reaction tube, 1.3 Torr; a cleaning time, 20 minutes; and a flow rate, 3500 SCCM, and the concentration of $ClF_3$, 20 vol % (104).

(viii) After the wafer boat was unloaded, the numbers of increased particles on the bare wafer surfaces in accordance with the same procedure as that of test A (test D). This test was repeated four times, and the obtained results are indicated by $D_1$ to $D_4$ in FIG. 11.

The above steps 102 to 104 were repeated four times. The obtained results are shown in FIG. 11.

As is apparent from FIG. 11, when the numbers $C_1$ and $C_2$ of increased particles obtained after the polysilicon film is formed were compared with the numbers $D_1$ to $D_4$ of increased particles obtained after the cleaning process was performed, significant differences were not recognized. Although some results ($D_1$ in the second and third tests) had the relatively large numbers of increased particles after the cleaning process was performed, the numbers were within an allowable range in a normal film forming process. As a result, it was confirmed that the cleaning process performed by etching using $ClF_3$ did not adversely affect a degree of cleaning of the inside of the reaction tube.

In the above tests, although a cleaning process is performed each time a film forming process is performed, the cleaning process may be performed after the film forming process is performed predetermined times.

Since a pre-coat film is formed by pre-coating process in step 102 on the inner wall surface of the outer tube or the inner and outer wall surfaces of the inner tube in the reaction tube subjected to the cleaning process, particles produced during the cleaning process and left on these wall surfaces are covered with pre-coat film. For this reason, these particles are not removed from the surfaces in the film forming process step (103), thereby preventing the particles from being deposited on the wafer surfaces.

An acceptable range and a most preferably thickness of the pre-coat film will be shown in Table 3.

TABLE 3

|  | Acceptable Range | Most preferably condition |
|---|---|---|
| Thickness of pre-coat film | 0.2 to 1 μm | 0.6 μm |

When the thickness of the pre-coat film is less than 0.2 μm, the particles produced by removing from the surface of quartz, which is roughened by etching of $ClF_3$, cannot be decreased sufficiently. On the other hand, when the thickness exceeds 1 μm, the film forming time is extended and the amount of the used source gas becomes larger, as a result, loss of the source gas occurs.

As a material for the pre-coat film, for example, polysilicon, silicon nitride, or silicon oxide can be used. However, the material is not limited by these and materials which are excellent in adhesive to a material (e.g., quartz) constituting the reaction tube or the like in the film forming process can be preferably used. More preferably, the same material as that of a film deposited on the wafer surface in the film forming step can be used.

As a matter of course, the pre-coating process, as described above, is performed when no wafer is present in the reaction tube after the cleaning process is performed. In addition, the pre-coating process includes the following processes. That is, in the film forming process step for the wafers, a film formed inside the reaction tube is left as a pre-coated film, and the next film forming process is performed.

Contamination occurring in the cleaning process was evaluated as follows.

(a) A polysilicon film having a thickness of 1 μm was deposited on the surface of a bare wafer, and this wafer was used as Sample I. This film forming process was performed under the following conditions: a process temperature, 620° C.; a pressure in the reaction tube, 1 Torr; a film forming process time, 100 minutes; and a source gas flow rate ratio, $SiH_4$, 120 SCCM.

(b) Upon completion of step (a), the inside of the reaction tube was cleaned by using a cleaning gas containing $ClF_3$. This cleaning process was performed under the following conditions: a process temperature, 630° C.; a pressure in the reaction tube, 1.3 Torr; a cleaning time, 120 minutes; and a flow rate, 3500 SCCM, and the concentration of $ClF_3$, 20 vol %.

(c) Upon completion of the cleaning process in step (b), a polysilicon film having a thickness of 1 μm was deposited on the surface of another bare wafer under the same conditions as those of step (a), and this wafer was used as Sample II. At this time, a polysilicon film having a thickness of 1 μm formed inside the reaction tube was left as a pre-coat film.

(d) Upon completion of the film forming process in step (c), a polysilicon film having a thickness of 1 μm was deposited on the surface of still another bare wafer under the same conditions as those of step (a). This wafer was used as Sample III.

In Samples I to III obtained as described above, amounts of impurities (Cl, F, Fe) in the polysilicon films on Samples I to III were measured by a microelement analyzer (SIMS). The obtained results are shown in FIGS. 12A to 12C and FIGS. 13A to 13C, respectively. As is apparent from FIGS. 12A to 12C and FIGS. 13A to 13C, when the amounts of impurities in the wafer (Sample I) subjected to the film forming process before the cleaning process was performed were compared with the amounts of impurities in the wafers (Samples II and III) subjected to the film forming process after the cleaning process was performed, significant differences were not recognized.

The results obtained by a test in which contamination occurring in wet-cleaning process using a conventional diluted HF solution is compared with contamination occurring in dry-cleaning process according to the present invention are shown in Table 4.

TABLE 4

| | Sample | F | Cl |
|---|---|---|---|
| Dry-cleaning | II | $1.7 \times 10^{13}$ | $4.0 \times 10^{10}$ |
| | III | $9.0 \times 10^{12}$ | $1.7 \times 10^{10}$ |
| | IV | $7.0 \times 10^{12}$ | $1.4 \times 10^{10}$ |
| Wet-cleaning | V | $4.1 \times 10^{12}$ | $1.2 \times 10^{11}$ |
| | VI | $2.8 \times 10^{12}$ | $5.8 \times 10^{10}$ |
| | VII | $1.9 \times 10^{12}$ | $2.1 \times 10^{10}$ |

In Table 4, Sample IV is obtained by performing the same film forming process as that in step (d) after forming a film whose thickness of 5 μm. Comparative Samples V to VII obtained by using wet-cleaning process correspond to Samples II to IV obtained by dry-cleaning process. Comparison Samples V to VII are obtained when the inside of the reaction tube is cleaned, in accordance with a conventional method using a diluted HF solution, by wet-cleaning process in place of the dry-cleaning process using a cleaning gas containing $ClF_3$ in step (b).

As is apparent from Table 4, when Samples II to IV obtained by applying the dry-cleaning process using the cleaning gas containing $ClF_3$ were compared with Comparison Samples V to VII obtained by applying the wet-cleaning process using the diluted HF solution, significant differences between the amounts of impurities (F, Cl) in the polysilicon films on Samples II to IV and the amounts of impurities in the polysilicon films on Samples V to VII were not recognized.

As a result, it was confirmed that the cleaning process using $ClF_3$ according to the present invention causes no contamination in a film forming process.

In the meantime, along with the cleaning of the inside of the reaction tube 2 described above, the interior of the above exhaust pipe system 34 is also cleaned. More specifically, when the exhaust gas used for the film forming process, which contains reactive gases including $SiH_4$ gas, is introduced to the exhaust pipe system 34 while maintaining the high temperature of the exhaust gas, the film forming reaction occurs in the exhaust piping system 34, and Si-based films are deposited on the inner wall surface of the exhaust pipe. In order to remove these Si-based films deposited, a cleaning gas obtained by diluting $ClF_3$ with a charge gas is supplied thereto after the CVD film forming process is completed.

The cleaning gas is, for example, as shown in FIG. 1, is introduced from the cleaning gas supply system 14 to the reaction tube 2, and then via the gas exhaust pipe 23 into the exhaust piping system 34. The cleaning gas supplied to the exhaust piping system 34 passes through a path running from the main exhaust pipe 24 to the vacuum pump 25, a path running to the main exhaust pipe 24 via the first sub-exhaust pipe 26, the first sub-valve 29, the needle valve 30 and the oxygen gas concentration sensor 31 in order, and a path running to the main exhaust pipe 24 via the second sub-exhaust pipe 27 and the second sub-valve 32. while the gas flowing through these paths, Si-based films deposited on the inner wall surface of the members of the exhaust piping system 34 are removed as they are etched by $ClF_3$ contained in the cleaning gas.

As described above, the Si-based films deposited on the inner wall surface of the members of the exhaust piping system 34 are removed by supplying the cleaning gas to the exhaust piping system 34, and therefore the exhaust pipes, especially, the first sub-exhaust pipe 26 and the second sub-exhaust pipe 27, which have small inner diameters, are prevented from being plugged up with the Si-based films deposited within the exhaust piping system 34. Further, the method of the present invention can prevent the phenomenon in which Si-based films are peeled and flow back into the reaction tube 2, and adhered to a semiconductor wafer 11, which decreases the yield of the semiconductor devices.

Further, with the above-described cleaning method, it is not necessary to deassemble the pipe system 34 in order to remove Si-based films. Therefore, the test for checking the leakage of gas from the exhaust pipe system 34, which must be performed when the system 34 is reassembled, is not required. Thus, the maintenance of the vertical heat treatment apparatus is very simple, and the producibility of the semiconductor devices can be improved.

The above descriptions are directed to the cleaning of Si-based films in the exhaust piping system however the present invention is not limited to such descriptions. Naturally, the invention can be applied to the removal of films deposited on the inner wall of the exhaust piping system 34, which are created in various types of film forming processes including silicon nitride film formation process.

Further, the cleaning gas can be supplied separately to the piping system 34. That is, as shown in FIG. 14, a gas introducing pipe 35, which branches off before the valve 14a of the gas introducing pipe 12 of the cleaning gas supply system 14 and is connected to the gas exhaust pipe 23 of the exhaust pipe system 34, for supplying the cleaning gas to the piping system 34, may be provided. In this case, the cleaning gas can be supplied to the piping system 34 only. More specifically, the valve 14a is closed and the valve 36 provided for the gas introducing pipe 35 is opened, the cleaning gas is introduced into the gas exhaust pipe 23 via the gas introducing pipes 12 and 35. When the cleaning gas is supplied only to the exhaust piping system 34, separately from the reaction tube 2, films deposited in the piping system 34, can be removed while performing some other process in the reaction tube 2.

Furthermore, as shown in FIG. 15, heating means 40 such as a tape heater including a heating wire inside can be provided around the gas exhaustion pipe 23 and the main exhaustion pipe 24. In this case, the gas exhaustion pipe 23 and the main exhaustion pipe 24 are heated by the heating means 40, and consequently the cleaning gas flowing therethourgh is heated, so as to set the temperature to a suitable one for etching of the films by $ClF_3$. Thus, the removal of the films can be carried out at a higher efficiency.

The method of cleaning a tantalum oxide ($Ta_2O_5$) film with a cleaning gas containing chlorine trifluoride ($ClF_3$) will be described.

Figure 16:
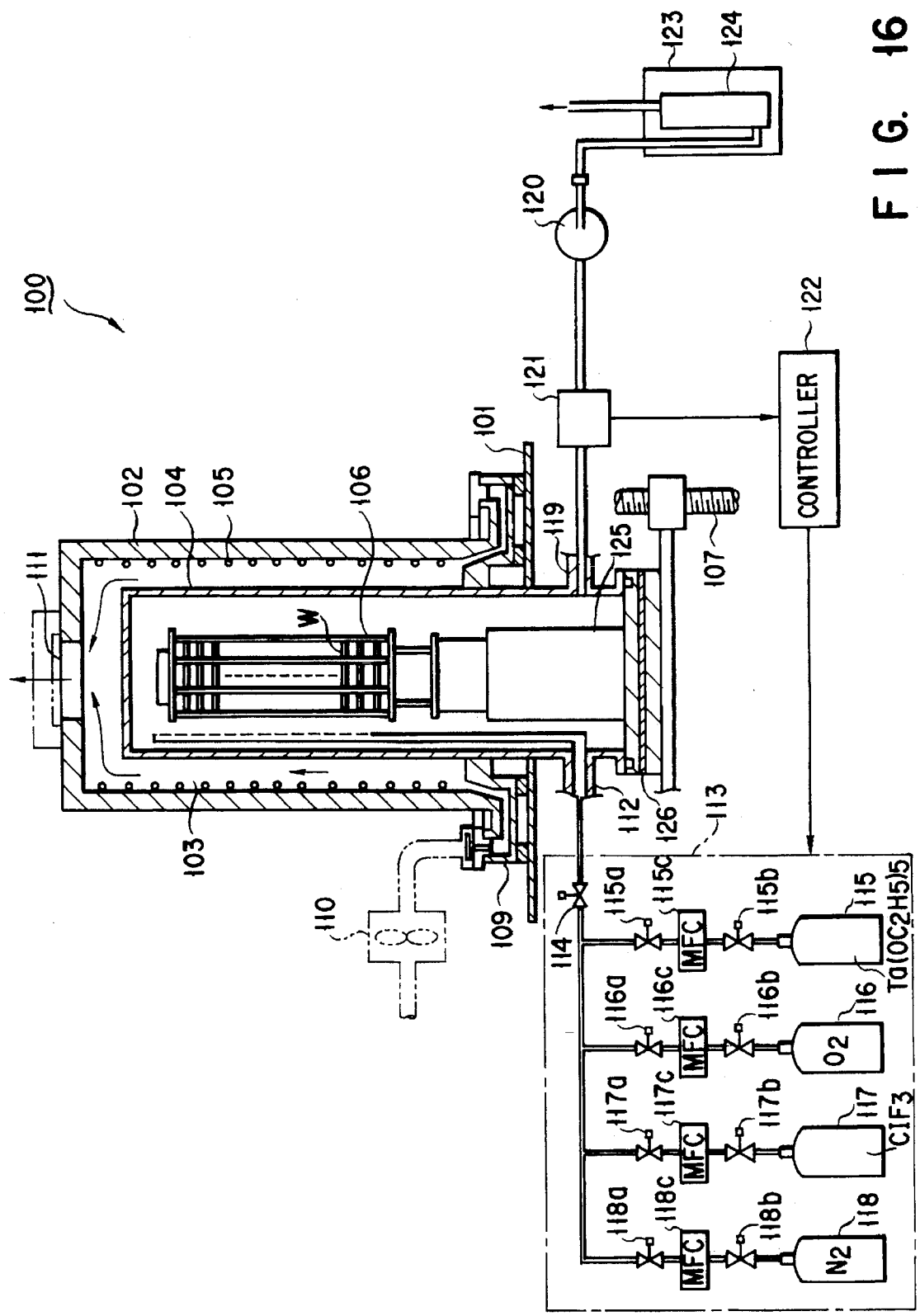
FIG. 16 is a schematic diagram showing an embodiment of a pressure reduction CVD apparatus for forming a tantalum oxide film in which the cleaning method for the reaction tube, according to the present invention, is applied.

FIG. 16 is a diagram showing a pressure reduction CVD apparatus 100 of the high-speed vertical heat treatment type, for forming a tantalum oxide film on a semiconductor wafer W. The pressure-reduction CVD apparatus 100 includes an outer tube 102 vertically supported on a base 101 horizontally fixed, and having a heat insulating property, and substantially a cylindrical shape, whose upper end is closed. In the outer tube 102, a reaction tube 104 having substantially a cylindrical shape and a closed upper end, is provided. The outer tube 102 and the inner tube 104 are arranged at a predetermined interval. The reaction tube 104 is made of, for example, quartz. On the inner periphery wall of the outer tube 102, a heater 105 such as a resistance heat generator is spirally provided such as to surround the reaction tube 104.

Meanwhile, a wafer boat 106 is loaded/unloaded into/from the reaction tube 104 by a lifting mechanism 107. The wafer boat 106 includes a cover 126 supported by lifting means 107, a heat reserving cover 125 placed on the cover 126, and a holder portion 106a, mounted on the heat reserving cover 125, for holding a plurality of semiconductor wafers W. The wafer boat 106 can hold the semiconductor wafers in such a manner that they are horizontally arranged in a vertical direction with intervals between adjacent ones. The wafer boat 106 is made of, for example, quartz.

If necessary, the region of the outer side of the reaction tube 104 is divided into a plurality of zones in the vertical direction, and a heater is provided for each one of the zones. With this structure, different temperatures can be set for different zones. Therefore, the difference in film forming condition between the upper and lower sections of the wafer boat 106 can be narrowed.

An air suction opening 108 communicated with a space 103 between the outer tube 102 and the inner tube 104 is situated in the bottom portion of the outer tube 102. To the space 103, cooled air can be supplied by an air supplying fan 110 connected via a manifold 109. An air outlet 111 also communicated with the space 103 is provided on the top portion of the outer tube 102, and the air contained in the space 103 is exhausted.

A gas introduction tube 112 is provided on the bottom portion of the reaction tube 104. A gas supply system 113 is connected to the gas introduction tube 112 via a valve 114. The gas supply system 113 mainly consists of various gas sources for supplying a source gas and cleaning gas into the reaction tube 104, valves and a flow controller. Specifically, a pentaethoxytantalum ($Ta(OC_2H_5)_5$) gas supply portion 115 and an oxygen ($O_2$) gas supply portion 116 are provided as the treatment gas sources. Further, a chlorine trifluoride ($ClF_3$) gas supply portion 117 is provided as the source of etching gas for cleaning. Further, a nitrogen ($N_2$) gas supply portion 118 is provided for a diluting gas source or a purge gas source.

The $Ta(OC_2H_5)_5$ gas supply portion 115 is communicated with the gas introduction tube 112 via a valves 115a and 115b, and a mass flow controller (MFC) 115c. Similarly, the $O_2$ gas supply portion 116, the $ClF_3$ gas supply portion 117 and the $N_2$ gas supply portion 118 are communicated with the gas introduction tube 112 via valves 116a, 116b, 117a, 117b, 118a, and 118b, and mass flow controllers 116c, 117c and 118c.

With the gas supply system 113 having the above structure, the valves and the mass flow controllers are controlled and a desired gas can be introduced into the reaction tube 104 at a desired flow rate during the film forming process and the dry cleaning process.

The various types of gases introduced into the reaction tube 104 via the gas introduction tube 112 are discharged to a vacuum pump 120 via an exhaustion tube 119 provided at the lower end of the reaction tube 104. It is preferable that an oil-free dry pump should be used as the vacuum pump 120. This is because it is a high possibility that $ClF_3$ used as the cleaning gas, if a general dry pump is used, causes a deterioration of the pump oil, or a degradation of the pump itself due to chlorine or fluorine mixedly contained in oil.

Further, a sensor 121 such as an infrared counter or UV counter, for measuring the amount of reaction products discarded from the reaction tube 104 is provided between the exhaustion tube 119 and the vacuum pump 120. The sensor 121 outputs a detection signal to a controller 122. The controller 122 outputs a control signal to each of the valves and the MFCs of the gas supply system 113, based on the detection signal.

Next, the step of forming a tantalum oxide film using the above reduction-pressure CVD apparatus 100 and the dry cleaning step for the reaction tube 104 will be described with reference to FIG. 17. The wafer W, the object to be processed, is, for example, a semiconductor wafer having a diameter of 8 inches.

First, a tantalum oxide film is formed on the surface of a wafer W (step 21 in FIG. 17). In this film forming process, the reaction tube 104 is heated by the heater 105, and the inside of the reaction tube 104 is set at a predetermined processing temperature, for example, 400° C.

The wafer boat 106 holding a plurality of wafers W is loaded in the reaction tube 104. The loading of the wafer boat 106 is carried out as the lift mechanism 107 lifts the wafer boat 106. At this time, the opening of the bottom portion of the reaction tube 104 is air-tightly sealed by the cover 126 situated at the lower end of the wafer boat 106.

Next, the pressure in the reaction tube 104 is decreased to, for example, about 0.5 Torr by the vacuum pump 120 connected to the exhaustion tube 119. After that, the $Ta(OC_2H_5)_5$ gas and $O_2$ gas diluted with $N_2$ gas are supplied from the gas supply system 113 via the gas introduction tube 112 at a predetermined flow rate. The $Ta(OC_2H_5)_5$ gas and $O_2$ gas supplied react with each other under the high temperature and reduced-pressure conditions. During the reaction, a tantalum oxide film is deposited on the surface of the wafer W.

After the film forming process is completed, the exhaustion gas in the reaction tube 104 is exhausted. More specifically, while discarding the exhaustion gas in the reaction tube 104 from an exhaustion outlet 111, an insert gas such as $N_2$ gas, is introduced into the reaction tube 104 so as to convert the inside of the tube 104 to an $N_2$ gas atmosphere. In this manner, the processing gas in the reaction tube 104 is removed, and a harmless and atmospheric state is created in the tube 104. After that, the wafer boat 106 is unloaded from the reaction tube 104 by the lifting means 107. When one film forming process including a series of film forming steps is completed, the process is then carried out on the next lot.

When the film forming step S21 is repeated for a long period of time, a tantalum oxide film is formed on, not only the object to be processed, but also surfaces of jigs of the reduced-pressure CVD apparatus 100, for example, an inner wall of the reaction tube 104. The tantalum oxide film formed on these jigs peels off to cause particles. Particles are likely to adhere on the surface of the wafer W during the film forming process. As a result, the yield of wafer W is reduced.

In order to solve the above problem, it is checked whether or not a tantalum oxide film is formed on the parts other than the object to be processed, particularly, the portions made of quartz (step 22 shown in FIG. 17). When it is judged that the tantalum oxide may become a particle source, the dry cleaning by etching with $ClF_3$, described below, is carried out (step S23 shown in FIG. 17). That is, the cover 126 is lifted by the lifting means 107, and the opening of the reaction tube 104 is sealed with the cover 126. Next, a $ClF_3$ gas (called cleaning gas hereinafter) diluted with $N_2$ gas is supplied from the gas supply system 113 into the reaction tube 104. Thus, the tantalum oxide film adhered on the inner wall and the like of the reaction tube 104 can be removed by etching with $ClF_3$.

Throughout this process, the inside of the reaction tube 104 is maintained at substantially the same temperature as that of the film forming process, that is, 350° C. to 500° C., preferably, about 400° C. When the processing temperature is set at 500° C. or higher, the etching rate is rendered excessively high, thus damaging quartz which constitutes the process tube 104, whereas when the processing temperature is set lower than 350° C., the etching rate is excessively lowered, thus requiring a very long time to finish the cleaning process for the tantalum oxide film.

The gas flow rate is set within a range of 700 to 1400 SCCM. When the gas flow rate is set at 1400 SCCM or higher, the consumption of the cleaning gas is increased, thereby raising the cost of the cleaning process, whereas when the gas flow rate is set lower than 700 SCCM, the etching rate is significantly lowered, thus requiring a very long time to finish the cleaning process for the tantalum oxide film.

The pressure in the reaction tube 104 is maintained in a range of 0.5 Torr to 1.25 Torr, preferably, about 0.8 Torr. When the pressure is set at 1.25 Torr or higher, the unevenness of etching results in the reaction tube 104, making it impossible to obtain a desired cleaning effect, whereas when the pressure is set lower than 0.5 Torr, the etching rate is significantly lowered, thus requiring a very long time to finish the cleaning process for the tantalum oxide film.

During the dry cleaning process as above, the exhaustion gas discarded via the exhaustion tube 119 is monitored by the sensor 121. Based on the signal from the sensor 121, the controller 122 sends a signal to the gas supply source .113 to stop the supply of the cleaning gas when it is judged that the amount of reaction products, for example, tantalum fluoride or tantalum chloride, a generated during the dry cleaning process for the tantalum oxide film, is at a predetermined value or less (step 24 shown in FIG. 17). Thus, the cleaning process of a series of cleaning steps is completed. Consequently, the damage to quartz, caused by over-etching, i.e. continuously performing excessive etching, can be prevented.

As described, with the method of removing tantalum oxide using a cleaning gas containing $ClF_3$, tantalum oxide film adhered to the members and jigs in the reaction tube 104, excluding wafers W, can be removed without damaging the reduced-pressure CVD apparatus 100, unlike the case of the conventional wet cleaning using an HF solution. Further, the cleaning operation can be carried out while maintaining the inside of the reaction tube 104 at the same temperature as that of the film forming process of a tantalum oxide film. Consequently, it is not necessary to set the temperature in the reaction tube 104 once back to room temperature, and therefore the film forming process and the cleaning process can be continuously conducted without stopping the heating by the heater 105. Therefore, it is not necessary to restart the reduction-pressure CVD apparatus 100, which is required when the heater 105 is once turned off. Accordingly, the time required for the maintenance of the reduction-pressure CVD apparatus 100 is remarkably shortened, the throughput of the process of semiconductor wafers W is significantly improved, and the cost of the operation is reduced.

Further, as the processing temperature, pressure and gas flow rate are set at appropriate values, the etching rate with use of the cleaning gas containing $ClF_3$ can be set high for tantalum oxide and set low for quartz. Therefore, the damage to the quartz-made jigs and members of the reaction tube 104 can be suppressed to the minimum level, and the tantalum oxide film can be effectively removed.

During the cleaning process, the amount of reaction products contained in the exhaustion gas is monitored by the sensor 121. When the amount of the reaction products is monitored to be a predetermined value or less, the cleaning process is stopped, thus removing only the tantalum oxide film, and preventing the damage to the quartz-made jigs and members of the reaction tube 104 caused by overetching.

Next, another example of the method of cleaning a tantalum oxide film will be described with reference to FIG. 18. In this example, a film forming process and a simple cleaning process are repetitiously performed so as to reduce the frequency of performing the maintenance.

Figure 18:
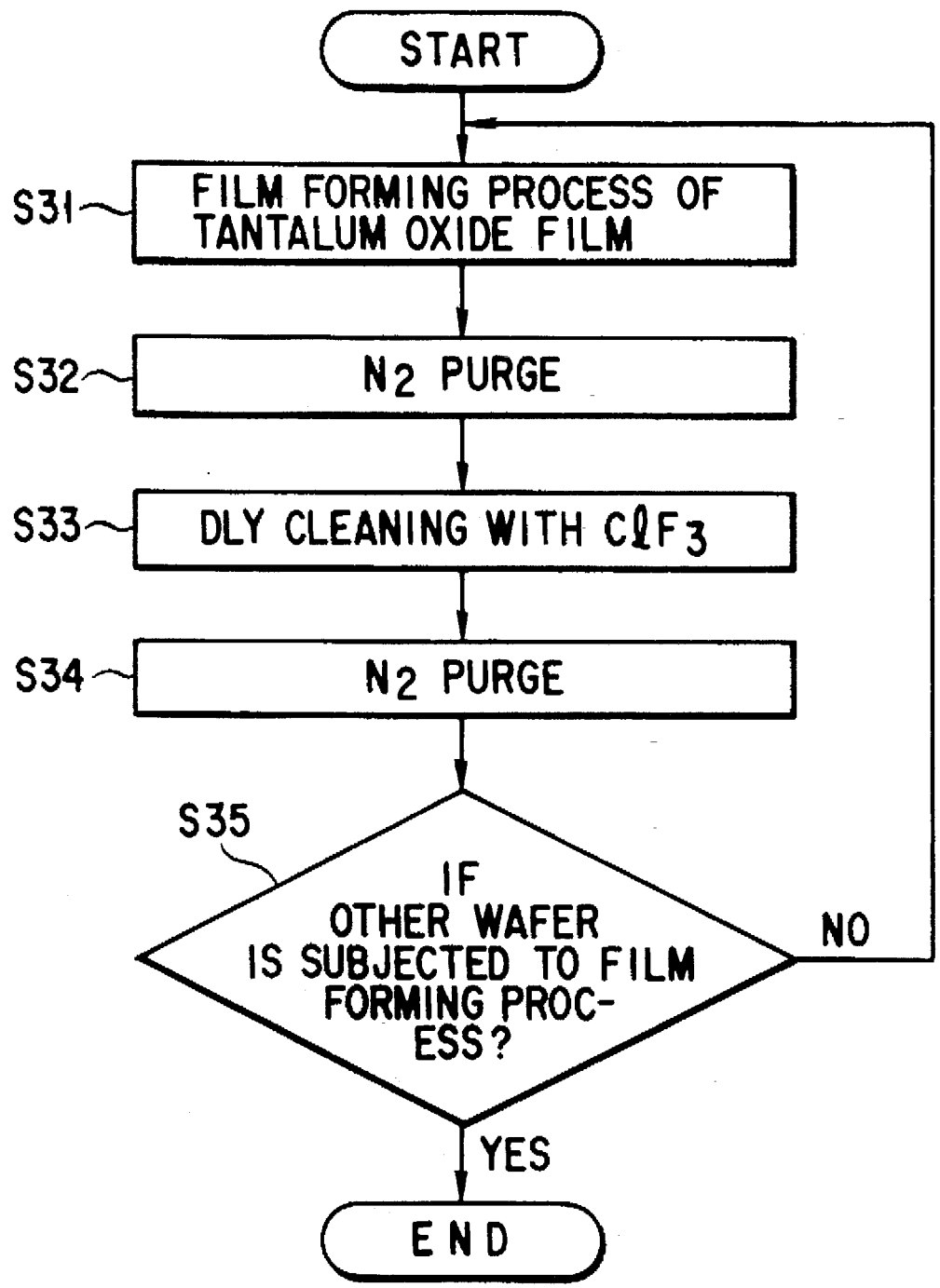
FIG. 18 is a flowchart illustrating a sequence of an another embodiment of a method of forming a tantalum oxide film according to the present invention.

More specifically, first, a tantalum oxide film is formed on the surface of a wafer W in the same procedure as that of the above-mentioned step 21 (step 31 shown in FIG. 18).

Next, while discarding the exhaustion gas in the reaction tube 104 of the reduction-pressure CVD apparatus 100, an insert has such as $N_2$ gas is introduced into the reaction tube 104, thus converting the inside of the tube into an $N_2$ gas atmosphere (step 32 shown in FIG. 18).

Then, the dry cleaning process using a cleaning gas containing $ClF_3$ gas is carried out (step 33 shown in FIG. 18) in the same procedure as that of the above-mentioned step 23.

After that, while discarding the cleaning gas in the reaction tube 104 of the reduction-pressure CVD apparatus 100, an insert has such as $N_2$ gas is introduced into the reaction tube 104, thus converting the inside of the tube into an $N_2$ gas atmosphere (step 34 shown in FIG. 18).

In the case where the film forming process is carried out on another wafer, the operation is set back to step S31 (step 35 shown in FIG. 18).

With this example, the coating of the inner wall and other Jigs of the reaction tube 104, which are made of quartz, with a tantalum oxide film can be suppressed to the minimum level. Consequently, the frequency of performing a large-scale maintenance, namely the overall cleaning of the heat processing apparatus as it is turned off and decomposed, can be reduced to the minimum level. Therefore, the throughput can be significantly improved by the continuous drive.

Next, a test for checking the effect of the above-described cleaning method for a tantalum oxide film, using a cleaning gas containing $ClF_3$ gas, will be described.

Five semiconductor wafers W each pre-coated substantially uniformly with a tantalum oxide film having a thickness of about 4000 Å were set in each of the top portion, center portion and bottom portion of the wafer boat 106 of the reduced-pressure CVD apparatus 100 shown in FIG. 16. Then, in the procedure shown in FIG. 17, a $ClF_3$ gas of a flow rate of 700 SCCM, which was diluted with $N_2$ gas of a flow rate of 2800 SCCM was introduced as a cleaning gas into the reaction tube 104 maintained at a processing temperature of 405° C. and a processing temperature of 0.8 Torr, and an etching process (dry cleaning process) was carried out for 1 minute. Then, the thickness of the tantalum oxide film on the surface of each wafer was measured before and after the etching, and the difference in thickness before and after the etching and the etching rate were obtained. The results were summarized in Table 5.

TABLE 5

Rate of etching of $Ta_2O_5$ film using $ClF_3$

| Temperature | 405° C. | $N_2$ = 2800 SCCM |
| Pressure | 0.8 Torr | $ClF_3$= 700 SCCM |
| Etching time | 1 minute | |

| Section in processing container | | Before etching | After etching | Difference | E/R [Å/min] |
|---|---|---|---|---|---|
| Top portion | 1 | 3942 | 2113 | 1829 | 2582 |
| | 2 | 4835 | 2006 | 2829 | |
| | 3 | 4648 | 2248 | 2400 | |
| | 4 | 4167 | 1299 | 2868 | |
| | 5 | 4177 | 1192 | 2985 | |
| | Average | 4354 | 1772 | 2582 | |
| Center portion | 1 | 3939 | 267 | 3672 | 3997 |
| | 2 | 4885 | 377 | 4508 | |
| | 3 | 4377 | 256 | 4121 | |
| | 4 | 4157 | 361 | 3796 | |
| | 5 | 4201 | 314 | 3887 | |
| | Average | 4312 | 315 | 3997 | |
| Bottom portion | 1 | 3931 | 0 | 3931 | 4306 or more |
| | 2 | 4899 | 0 | 4899 | |
| | 3 | 4375 | 0 | 4375 | |
| | 4 | 4125 | 0 | 4125 | |
| | 5 | 4202 | 0 | 4202 | |
| | Average | 4306 | 0 | 4306 | |

As is clear from Table 5, it was confirmed that although a slight difference resulted in thickness between the bottom portion of the reaction tube 104, where a sufficient amount of cleaning gas was secured and the top portion where a sufficient amount of cleaning gas was not secured, the tantalum oxide film could be etched at a high etching rate within one minute, thus achieving an etching rate of about 2000 to 4000 Å per minute.

Lastly, the present invention is not limited to the above examples, but can be remodeled into numerous versions as long as the essence of the invention remains. For example, the present invention was described in the examples in the form of a batch-type CVD apparatus; however it can be applied to a one-by-one type CVD apparatus. Further, the processing temperature, processing pressure, flow rate, processing time and processing method can be varied in accordance with the processing conditions within the ranges of the features of the invention recited in the claims.

Additional advantages and modifications will readily occur to those skilled in the art. Therefore, the invention in its broader aspects is not limited to the specific details, representative devices shown and described herein. Accordingly, various modifications may be made without departing from the spirit or scope of the general inventive concept as defined by the appended claims and their equivalents.

What is claimed is:

1. A method of cleaning the interior of a reaction tube and an exhaust piping system in a heat treatment apparatus, comprising:

supplying a cleaning gas containing $ClF_3$ from a cleaning gas supply source through a first cleaning gas supply pipe to the interior of said reaction tube and to the exhaust piping system connected to the interior of said reaction tube, so as to remove a film deposited on an inner wall surface of said reaction tube or on a surface of a member contained in said reaction tube and on an inner surface of said exhaust piping system by etching, wherein said cleaning gas is supplied while the temperature in said reaction tube is maintained at 450° C. or higher, and in a pressure condition set at the maintained temperature such that an etching rate of said film by the cleaning gas is higher than an etching rate of a material of said reaction tube or a member incorporated in said reaction tube, and wherein, when processing other than cleaning the interior of said reaction tube is executed in said reaction tube, said cleaning gas is supplied from said cleaning gas supply source only to the exhaust piping system, through a second cleaning gas supply pipe provided independently of the first cleaning gas supply pipe, so as to remove a film deposited on the inner surface of said exhaust piping system by etching.

2. A method according to claim 1, wherein a pressure is within a range of 0.3 to 5 Torr.

3. A method according to claim 1, wherein said second cleaning gas supply pipe is a branch pipe extending from a point located before a first valve inside the first cleaning gas supply pipe, and said second cleaning pipe is connected to the exhaust piping system and contains a second valve at an intermediate point thereof.

4. A method according to claim 1, wherein a concentration of $ClF_3$ contained in said cleaning gas is 10 to 50 vol %.

5. A method according to claim 4, wherein a flow rate of the cleaning gas to an area of an object to be processed is in a range of 750 to 3500 $SCCM/m^2$.

6. A method according to claim 1, wherein the film is one selected from a group consisting of a polysilicon-based film, a silicon-nitride-based film, a silicon-oxide-based film and a tantalum-oxide-based film.

7. A method according to claim 6, wherein when the film is the polysilicon-based film, a temperature in said reaction tube is 450° C. to 650° C., a flow rate of the cleaning gas to the area of the object to be processed is 750 to 3500 $SCCM/m^2$, and a pressure is 0.3 to 5 Torr.

8. A method according to claim 7, wherein the cleaning gas is supplied for 50 to 150 minutes.

9. A method according to claim 6, wherein when the film is the silicon-nitride-based film, a temperature in said reaction tube is 550° C. to 650° C., a flow rate of the cleaning gas to the area of the object to be processed is 750 to 3500 $SCCM/m^2$, and a pressure is 0.3 to 5 Torr.

10. A method according to claim 9, wherein the cleaning gas is supplied for 50 to 150 minutes.

11. A method according to claim 6, wherein when the film is the silicon-oxide-based film, a temperature in said reaction tube is 450° C. to 650° C., a flow rate of the cleaning gas to the area of the object to be processed is 750 to 3500 $SCCM/m^2$, and a pressure is 0.3 to 5 Torr.

12. A method according to claim 11, wherein a process time is 50 to 150 minutes.

13. A method according to claim 1, wherein said exhaust piping system comprises: exhaust means having a main exhaust system and a sub-exhaust system of exhaust pressure lower than that of said main exhaust system, for evacuating said reaction tube; and detection means for detecting an oxygen gas concentration or an oxygen gas partial pressure in said reaction tube while being evacuated by the sub-exhaust system.

14. A method according to claim 13, wherein said main exhaust system includes a main exhaust path running to the reaction tube, a main valve provided for the main exhaust path, for opening/closing the main exhaust path, and a vacuum pump for evacuating the reaction tube via the main exhaust path.

15. A method according to claim 13, wherein said sub-exhaust system includes a first sub-exhaust path and a second sub-exhaust path parallely connected to the main exhaust path, first and second sub-valves respectively provided for the first and second sub-exhaust paths, a needle valve provided for the first sub-exhaust path for adjusting an exhaustion amount, and a vacuum pump for evacuating said reaction tube via the first subs-exhaust path and the second sub-exhaust path, and said detecting means is provided for the first sub-exhaust path.

16. A cleaning method of cleaning interiors of a reaction tube and an exhaust piping system which are employed in a heat treatment apparatus and connected together, comprising the steps of:

supplying a cleaning gas containing $ClF_3$ from a cleaning gas supply source through a first cleaning gas supply pipe to the interiors of the reaction tube and the exhaust piping system so as to remove a film deposited on an inner wall surface of said reaction tube or a surface of a member contained in said reaction tube and on an inner surface of said exhaust piping system by etching, and supplying the cleaning gas from the cleaning gas supply source only to the exhaust piping system through a second cleaning gas supply pipe provided independently of the first cleaning gas supply pipe when processing other than cleaning the interior of the reaction tube is being executed in the reaction tube, so as to remove a film deposited on the inner surface of said exhaust piping system by etching.

* * * * *